(12) United States Patent
Wu et al.

(10) Patent No.: US 9,886,910 B2
(45) Date of Patent: Feb. 6, 2018

(54) DISPLAY DEVICE AND METHOD OF DRIVING DISPLAY DEVICE

(71) Applicant: Japan Display Inc., Tokyo (JP)

(72) Inventors: Ilin Wu, Tokyo (JP); Duzen Peng, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/341,029

(22) Filed: Nov. 2, 2016

(65) Prior Publication Data

US 2017/0132980 A1 May 11, 2017

(30) Foreign Application Priority Data

Nov. 9, 2015 (JP) .................. 2015-219335

(51) Int. Cl.
*G09G 3/30* (2006.01)
*G09G 3/3291* (2016.01)
*G09G 3/3233* (2016.01)
*H01L 27/32* (2006.01)

(52) U.S. Cl.
CPC ......... *G09G 3/3291* (2013.01); *G09G 3/3233* (2013.01); *H01L 27/3225* (2013.01); *H01L 27/3262* (2013.01); *H01L 27/3276* (2013.01); *G09G 2300/043* (2013.01); *G09G 2310/08* (2013.01); *G09G 2320/0233* (2013.01); *G09G 2320/045* (2013.01)

(58) Field of Classification Search
CPC .. G09G 3/12; G09G 3/14; G09G 3/30–3/3291
See application file for complete search history.

(56) References Cited

U.S. PATENT DOCUMENTS

2006/0023551 A1    2/2006   Peng et al.
2007/0262931 A1   11/2007   Peng et al.

*Primary Examiner* — Sanghyuk Park
(74) *Attorney, Agent, or Firm* — Typha IP LLC

(57) ABSTRACT

A display device including a pixel, a drive transistor including a first and a second terminal and a gate, a first switching element controlling a connection between the second terminal and the gate, a storage capacitor of a second terminal connected to the gate, a second switching element controlling a connection between the storage capacitor and a first signal line, a third switching element arranged in parallel with the second switching element and controlling a connection between the storage capacitor and a second signal line, a fourth switching element controlling a connection between the drive transistor and a first power supply line, a light emitting element connected with the drive transistor and a second power supply line, a fifth switching element controlling a connection between the drive transistor and the light emitting element, a sixth switching element controlling a connection between the drive transistor and a third power supply line.

17 Claims, 13 Drawing Sheets

DISPLAY DEVICE AND METHOD OF DRIVING DISPLAY DEVICE

CROSS REFERENCE TO RELATED APPLICATIONS

This application is based upon and claims the benefit of priority from the prior Japanese Patent Application No. 2015-219335 filed on Nov. 9, 2015, the entire contents of which are incorporated herein by reference.

FIELD

The present invention is related to a circuit structure of a pixel in a display device and a circuit structure which operates by compensating the characteristics of a transistor which drives a display element.

BACKGROUND

Display devices are being developed in which a light emitting element using an organic electroluminescence material is arranged in each pixel and an image is displayed by individually controlling the light which is emitted. A light emitting element includes a structure in which a layer having an organic electroluminescence material (also called an "organic layer") is sandwiched between a pair of electrodes, one being distinguished as an anode electrode and the other as a cathode electrode. A display device formed with a pixel using such a light emitted element includes a pixel electrode in which one of the electrodes is arranged in each pixel, and a common electrode in which the other electrode is applied with a voltage common to a plurality of pixels. A display device displays an image by individually controlling the voltage of a pixel electrode in each pixel and setting the voltage of a common electrode as a fixed voltage.

A light emitting element arranged in each pixel is connected to a transistor. Since the transistor drives the light emitting element, it is called as a drive transistor. A drive transistor arranged in each pixel in a pixel region arranged with pixels is ideally preferred to have uniform characteristics. However, a plurality of drive transistors actually arranged in a pixel region has variation in electrical characteristics. At times, there is variation in a threshold voltage of a drive transistor and due to this, even when the same gate voltage is applied to a plurality of drive transistors, a problem arises whereby a drain current fluctuates. As a result, it is known that variation in the luminosity of a light emitting element occurs which degrades the display quality of an image. In order to solve such problems, a technology has been developed which compensates for a threshold voltage of a drive transistor arranged in each pixel (for example, see U.S. Patent Application No. 2006/0023551 specification, and U.S. Patent Application No. 2007/00262931 specification).

SUMMARY

A display device in an embodiment according to the present invention includes a pixel including a drive transistor, a first switching element, a storage capacitor, a second switching element, a third switching element, a fourth switching element, a light emitting element, a fifth switching element and a sixth switching element, the drive transistor including a first terminal, a second terminal and a gate which controlling a current flowing between the first terminal and the second terminals, the first switching element controlling a connection between the second terminal and the gate of the drive transistor, the storage capacitor including a first terminal and a second terminal, the second terminal of the storage capacitor connected to the gate of the driving transistor, the second switching element controlling a connection between the first terminal of the storage capacitor and a first signal line supplied with a data signal, the third switching element arranged in parallel with the second switching element and controlling a connection between the first terminal of the storage capacitor and a second signal line supplied with a reference signal, the fourth switching element controlling a connection between the first terminal of the drive transistor and a first power supply line supplied with a first voltage, the light emitting element including a first terminal and a second terminal, the first terminal of the light emitting element connected with the second terminal of the drive transistor and the second terminal of the light emitting element connected with a second power supply line supplied with a second voltage lower than the first voltage, and the fifth switching element controlling a connection between the second terminal of the drive transistor and the first terminal of the light emitting element, the sixth switching element controlling a connection between the first terminal of the drive transistor and a third power supply line supplied with a third voltage lower than the first voltage and higher than the second voltage.

A method for driving a display device in an embodiment according to the present invention, a pixel including a drive transistor, a first switching element, a storage capacitor, a second switching element, a third switching element, a fourth switching element, a light emitting element, a fifth switching element and a sixth switching element, the drive transistor including a first terminal, a second terminal and a gate which controlling a current flowing between the first terminal and the second terminals, the first switching element controlling a connection between the second terminal and the gate of the drive transistor, the storage capacitor including a first terminal and a second terminal, the second terminal of the storage capacitor connected to the gate of the driving transistor, the second switching element controlling a connection between the first terminal of the storage capacitor and a first signal line supplied with a data signal, the third switching element arranged in parallel with the second switching element and controlling a connection between the first terminal of the storage capacitor and a second signal line supplied with a reference signal, the fourth switching element controlling a connection between the first terminal of the drive transistor and a first power supply line supplied with a first voltage, the light emitting element including a first terminal and a second terminal, the first terminal of the light emitting element connected with the second terminal of the drive transistor and the second terminal of the light emitting element connected with a second power supply line supplied with a second voltage lower than the first voltage, and the fifth switching element controlling a connection between the second terminal of the drive transistor and the first terminal of the light emitting element, the sixth switching element controlling a connection between the first terminal of the drive transistor and a third power supply line supplied with a third voltage lower than the first voltage and higher than the second voltage, the method including in a reset time period the first switching element and the fifth switching element are turned ON, the fourth switching element is turned OFF, a reference voltage is applied to the storage capacitor from the second signal line via the third switching element, and a third voltage is applied to the other input/output terminal of the drive transistor from the third power supply line, in a signal programming and offset cancel time period the first switching element and the fourth switching element are turned ON, the fifth switching element is turned OFF, a voltage based on a data signal from the first signal line is applied to the other terminal of the storage capacitor via the second switching element, and the first voltage is applied from the first power supply line and the third power supply line to the first terminal of the drive transistor, and in a light emitting time period the first switching element is turned OFF, the fourth switching element and the fifth switching element are turned ON, a reference voltage is applied to the first terminal of the storage capacitor via the third switching element, and the light emitting element emits light by a current flowing from the first power supply line via the drive transistor.

A display device in an embodiment according to the present invention includes a first pixel, a second pixel, a third pixel, and fourth pixel, each of the first to the fourth pixel including a drive transistor, a first switching element, a storage capacitor, a second switching element, a third switching element, a fourth switching element, a light emitting element and a fifth switching element, the drive transistor arranged including a first terminal, a second terminal and a gate which controlling a current flowing between the first terminal and the second terminals, the first switching element controlling a connection between the second terminals and the gate of the drive transistor, the storage capacitor including a first terminal and a second terminal, the second terminal of the storage capacitor connected to the gate of the driving transistor, the second switching element controlling a connection between the first terminal of the storage capacitor and a first signal line supplied with a data signal, the third switching element arranged in parallel with the second switching element and controlling a connection between the first terminal of the storage capacitor and a second signal line supplied with a reference signal, the fourth switching element controlling a connection between the first terminal of the drive transistor and a first power supply line supplied with a first voltage, the light emitting element including a first terminal and a second terminal, the first terminal of the light emitting element connected with the second terminal of the drive transistor and the second terminal of the light emitting element connected with a second power supply line supplied with a second voltage lower than the first voltage, and the fifth switching element controlling a connection between the second terminal of the drive transistor and the first terminal of the light emitting element. Each of the drive transistor included in the first to the fourth pixels connected to a third power supply line connected with a sixth switching element controlling the application of a third voltage lower than the first voltage and higher than the second voltage to the first terminal, the first and the second pixel, and the third and the fourth pixel are arranged in a row direction, the first and the third pixel, and the second and the fourth pixel are arranged in a column direction, the fourth switching element is shared between the first to fourth pixels, and the second switching element and the third switching element are shared between the first and third pixels, and the second and fourth pixels arranged in a column direction.

DESCRIPTION OF EMBODIMENTS

Figure 1:
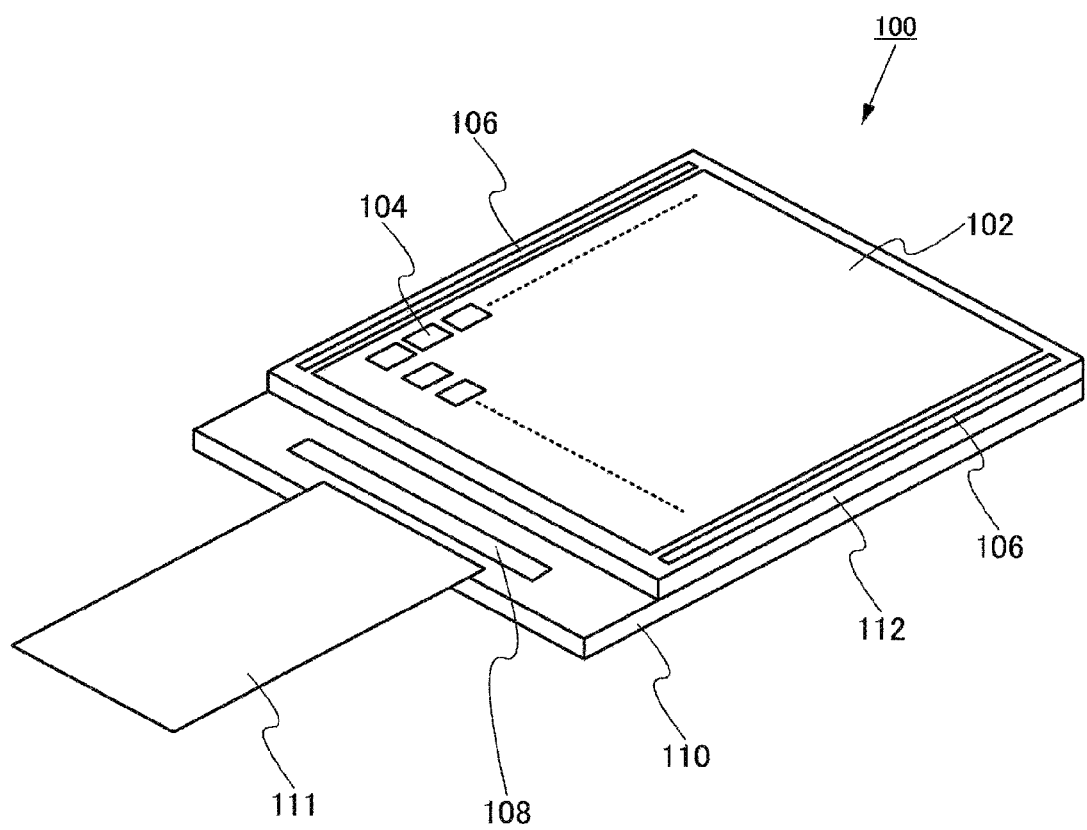
FIG. 1 is a perspective diagram for explaining a structure of a display device related to one embodiment of the present invention.

Embodiments of the present invention will hereinafter be described with reference to the drawings. However, the present invention can be implemented in many different modes, and is not to be interpreted as being limited to contents of description of embodiments illustrated below. While the width, the thickness, the shape, and the like of each of portions may be more schematically indicated than those in an actual mode to make the description clearer, this is only one example, and is not to limit the interpretation of the present invention. In the present specification and the drawings, detailed description may be omitted, as needed, by assigning similar elements to those described above with reference to the already described drawing the same reference signs.

In the present specification, when a member or region exists "on (or under)" another member or region, this includes not only a case where the member or region exists just above (or just below) the other member or region but also a case where the member or region exists above (or below) the other member or region, i.e., includes a case where another component is included between the member or region above (below) the other member or region and the other member or region except as otherwise limited.

In the present specification, electrically connected refers to a state in which a voltage path or a current path is formed. For example, a first transistor and a second transistor are electrically connected even when a third transistor is arranged between the first transistor and the second transistor. In addition, in the present specification, a connection is sometimes used to mean electrically connected.

In the case of an n channel type drive transistor, an offset cancel operation which compensates a threshold voltage of a drive transistor changes a source voltage by setting the source voltage to a floating state, and setting the voltage between the gate and source of the drive transistor to a threshold voltage Vth. A voltage of a data signal compensated with a threshold voltage is stored in a storage capacitor connected to the gate by writing a data voltage of a signal to be displayed in the pixel in this state.

In order to set a threshold voltage of a drive transistor between a gate and source (or gate and drain), it is necessary to apply a certain drain voltage to the drain of the drive transistor and cause a drain current to flow. However, when there is influence from wire resistance of a wire which applies a drain voltage, a problem occurs where variation is produced in the offset cancel operation itself and a threshold voltage Vth is not sufficiently compensated. For example, a problem occurs whereby a luminosity distribution is produced between pixels in a horizontal direction in a pixel region where wires which apply a drain voltage extend in a horizontal direction.

In addition, when a voltage drop occurs due to the influence of wire resistance, a problem occurs when offset cancel is not sufficiently performed and a threshold voltage of a drive transistor is not sufficiently compensated. This type of problem is particularly apparent when attempting to achieve miniaturization of wires using due to high definition of a pixel or large scale pixel regions (large screens).

According to one embodiment of the present invention described below, a display device and driving method of a display device are exemplified which can overcome this type of problem.

1. Structure of a Display Device

FIG. 1 shows a summary of a display device 100 related to one embodiment of the present invention using a perspective view. The display device 100 includes a pixel region 102 arranged with a plurality of pixels 104, a scanning line drive circuit 106, and a data line drive circuit 108. There are arranged in a first substrate 110. A terminal part 109 input with a signal is arranged in the first substrate 110. A wiring substrate 111 is connected to the terminal part 109. The wiring substrate 111 is also called a flexible circuit substrate (FPC substrate) and is used for connection with external devices which provide signal to the display device 100. The pixel region 102 is covered by a sealing member so as to not be exposed to the air. Although the sealing member 112 may be hard substrate such as a glass substrate, the sealing member 112 may also be an organic resin film substrate or an organic resin layer.

Figure 2:
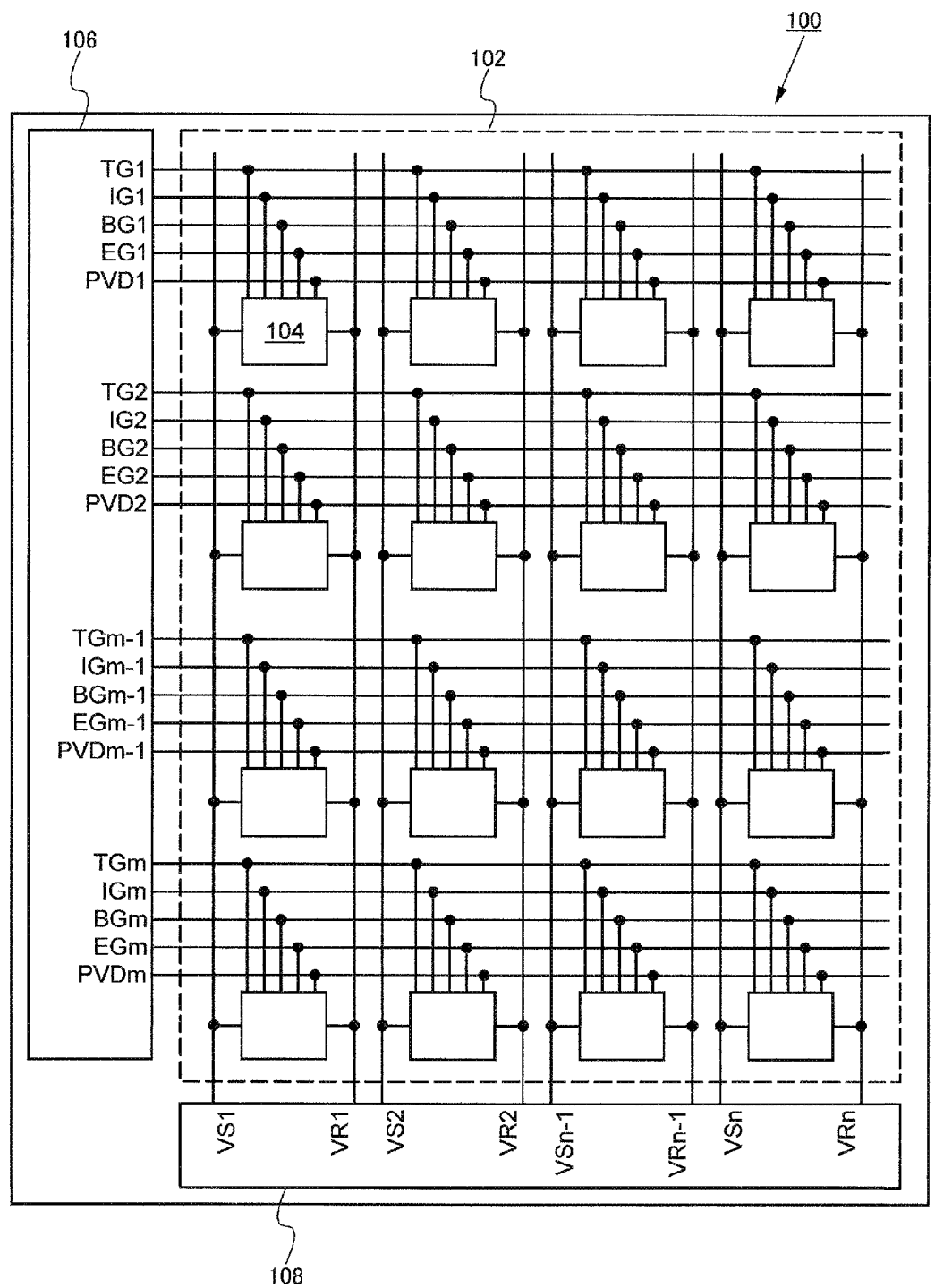
FIG. 2 is a diagram for explaining a structure of a display device related to one embodiment of the present invention.

FIG. 2 shows a structure of a wire arranged in the pixel region 102 in the display device 100. FIG. 2 shows an example in the case where pixels 104 are arranged in m number of rows and n number of columns in the display region 102. In this case, the number of pixels in the display region 102 is m×n pixels. Furthermore, although FIG. 2 shows an example where the pixels 104 are arranged in a square, the present invention is not limited to this arrangement and the pixels may also have a delta arrangement or other arrangement shape.

A display element is arranged in a pixel 104. Each pixel 104 is driven by a scanning line drive circuit 106 and data line drive circuit 108. In one embodiment of the present invention, a light emitting element is used as a display element. For example, an organic electroluminescence element which uses an organic electroluminescence material is used as the light emitting element.

The scanning line drive circuit 106 is connected with first scanning signal lines TG1~TGm, second scanning signal lines IG1~IGm, third scanning signal lines BG1~BGm, and fourth scanning signal lines EG1~EGm. The scanning line drive circuit 106 is formed including a shift register and a control signal is sequentially output to each scanning line. In the pixel region 102, the first scanning signal lines TG1~TGm, second scanning signal lines IG1~IGm, third scanning signal lines BG1~BGm, and fourth scanning signal lines EG1~EGm are arranged corresponding to each row of a pixel. In addition, power supply lines PVD1~PVDm corresponding to each row are connected from each scanning line drive circuit 106. Details of the power supply lines are described herein.

The data line drive circuit 108 is connected with first signal lines VS1~VSn and second signal lines VR1~VRn. The data line drive circuit 108 outputs a data signal for displaying an image to the first signal lines VS1~VSn. In addition, the data line drive circuit 108 outputs a reference signal to the second signal lines VR1~VRmn. In the pixel region 102, a first signal line Vs and second signal line VR are arranged corresponding to each column.

Furthermore, in the explanation given above, the reference symbols "m" and "n" are integers and correspond to the number of each signal line arranged in the pixel region 102.

2-1. Circuit Structure of a Pixel (Example 1)

Figure 3:
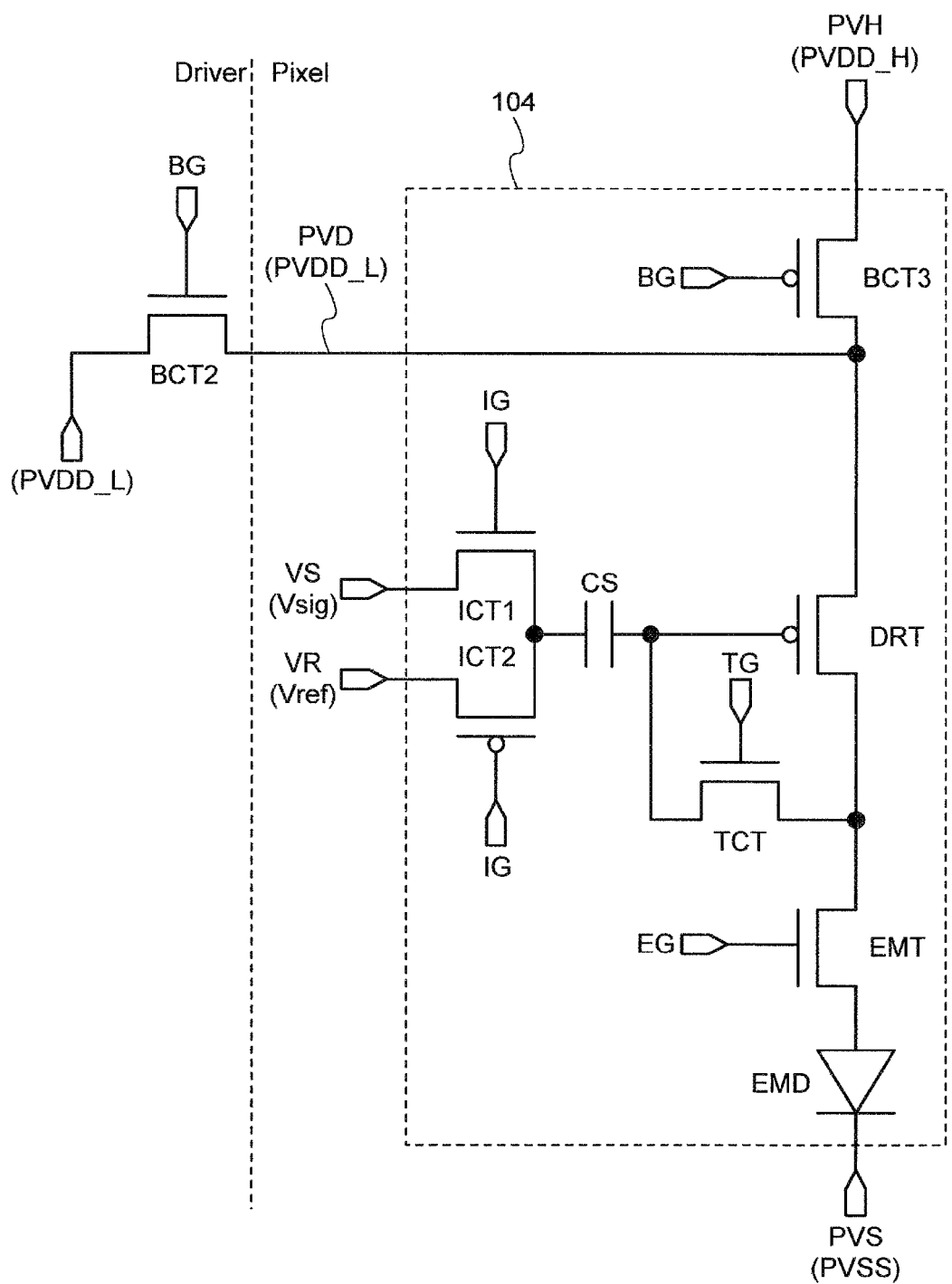
FIG. 3 is a diagram showing a circuit structure of a pixel in a display device related to one embodiment of the present invention.

FIG. 3 shows a circuit structure of a pixel 104. A pixel 104 of the display device 100 related to one embodiment of the present invention is formed including a first switching element TCT, a second switching element ICT1, a third switching element ICT2, a fourth switching element BCT3, a fifth switching element EMT, a light emitting element EMD, and a storage capacitor element CS.

As is explained below, a pixel 104 in the display device 100 related to one embodiment of the present invention includes a first conduction type transistor arranged with the first switching element TCT, second switching element ICT1, and fifth switching element EMT, and a conduction type transistor opposite to the first conduction type transistor arranged with the third switching element ICT2 and fourth switching element BCT3.

A drive transistor DRT is arranged with at least two input/output terminals (first terminal and second terminal) and a gate as a control terminal for controlling a current flowing between the input/output terminals. The drive transistor DRT is arranged with a source and drain as input/output terminals. An insulation gate type field effect transistor is used for the drive transistor DRT for example and a thin film transistor is favorably used as one type of insulation gate type field effect transistor.

In one embodiment of the present invention, a p channel type transistor is used for the drive transistor DRT. One input/output terminal (first terminal) of the drive transistor DRT is arranged on a first power supply line PVH side, and the other terminal (second terminal) is arranged on a second power supply line PVS side. In the explanation below, for convenience the input/output terminal on the first power supply line PVH side in the drive transistor DRT is given as the source and the input/output terminal on the second power supply line PVS side is given as the drain.

A first voltage PVDD_H is applied to the first power supply line PVH and a second voltage PVSS is applied to the second power supply line PVS. Here, the first voltage PVDD is assumed to be a higher voltage than the second voltage PVSS.

The light emitting element EMD is a two terminal (first terminal and second terminal) element which exhibits diode characteristics. The light emitting element EMD is biased in a forward direction and emits light when a voltage above a light emitting threshold voltage is applied. The light emitting intensity of the light emitting element EMD changes in proportion to an increase or decrease in the amount of current in a range of normal operation. One terminal (first terminal, anode for example) of the light emitting element EMD is electrically connected to one terminal (drain) of the drive transistor DRT, and the other terminal (second terminal, cathode for example) is electrically connected to the second supply line PVS.

The storage capacitor element CS is connected to the gate of the drive transistor DRT. In addition, the first switching element TCT is arranged between the gate and drain of the drive transistor DRT. The first switching element TCT controls the connection between one of the input/output terminals and the gate of the drive transistor DRT.

Furthermore, a switching element forms a conduction state when ON and forms a non-conducting state when OFF. A switching element is formed using a transistor for example.

The ON and OFF state of the first switching element TCT is controlled by a control signal (amplitude VGH/VGL) of the first scanning signal line TG. When the first switching element TCT is ON, the gate and drain are electrically connected and the drive transistor DRT becomes a diode connected state. In one embodiment of the present invention, the first switching element TCT is formed by an n channel type transistor.

Furthermore, a signal with an amplitude VGH as a control signal provided by a scanning signal line has a voltage level which switches an n channel type transistor ON and a p channel type transistor OFF, and a signal with an amplitude VGL (or amplitude VGL1) has a voltage level which switches an n channel type transistor OFF and a p channel type transistor ON.

On terminal (second terminal) of the storage capacitor element CS is electrically connected with the gate of the drive transistor DRT and the other terminal (first terminal) is connected with one terminal of the second switching element ICT1 and third switching element ICT2. The second switching element ICT1 and third switching element ICT2 are arranged in parallel and one terminal on the side input with a signal are both electrically connected with the other terminal of the storage capacitor element CS.

The other terminal which is the signal input side of the second switching element ICT1 is electrically connected with the first power supply line VS which is supplied with a data signal. The other terminal which is the signal input side of the third switching element ICTs is electrically connected with the second power supply line VR which is supplied with a reference signal. An ON/OFF operation of the second switching element ICT1 and third switching element ICT2 is controlled by a control signal (amplitude VGH/VGL) of the second scanning signal line IG.

The second switching element ICT1 and third switching element ITC2 perform an exclusive operation. That is, when the same control signal (amplitude VGH/VGL) is applied, one of the second switching element ICT1 or third switching element ITC2 is switched ON and the other is switched OFF. A circuit formed from the switching element ICT1 and third switching element ITC2 can be viewed as a selection circuit which outputs one signal with respect to two input signals. In order to realize this type of operation, in the case where the second switching element ICT1 is formed by a first conductive type transistor (for example, n channel type transistor), the third switching element ITC2 is formed by a second conductive type transistor (for example, p channel type transistor). The second conductive type is the reverse of the first conductive type. FIG. 3 shows the case where the second switching element ICT1 is formed by a n channel type transistor and the third switching element ICT2 is formed by a p channel type transistor.

The first terminal (source) of the drive transistor DRT is electrically connected with the first power supply line PVH via the fourth switching element BCT3. When the fourth switching element BT3 is ON, the source of the drive transistor DRT is in a conducting state with the first power supply line PVH and a first voltage PVDD_H is applied.

In addition, the third power supply line PVD is electrically connected to the source of the drive transistor DRT. The third voltage PVDD_L is applied to the third power supply line PVD. Furthermore, the third voltage PVD_L is lower than the first voltage PVDD_H, higher than the second voltage PVSS and is a voltage between the first voltage PVDD_H and second voltage PVSS.

The third power supply line PVD is connected with the sixth switching element BCT2. The third power supply line PVD is applied with the third voltage PVDD_L via the sixth switching element BCT2. The sixth switching element BCT2 controls the timing when the third voltage PVDD_L is applied to the third power supply line PVD. The sixth switching element BCT2 does not have to be arranged in the pixel 104 or pixel region 102, for example, the sixth switching element BCT2 may be arranged in a region of the scanning line driving circuit 106.

An ON/OFF operation of the sixth switching element BCT2 is controlled by a control signal (amplitude VGH/VGL) of the third scanning signal line BG. That is, an ON/OFF operation of the fourth switching element BCT3 and the sixth switching element BCT2 is controlled by the same control signal (amplitude VGH/VGL) of the third scanning signal line BG. Here, the fourth switching element BCT3 and the sixth switching element BCT2 perform an exclusive operation. That is, when the same control signal (amplitude VGH/VGL) is applied, one of the fourth switching element BCT3 or sixth switching element BTC2 is switched ON and the other is switched OFF. In order to realize this type of operation, in the case where the fourth switching element BCT3 is formed by a first conductive type transistor, the sixth switching element BTC2 is formed by a conductive type transistor the reverse of the first conductive type. FIG. 3 shows the case where the fourth switching element BCT3 is formed by a p channel type transistor and the sixth switching element BCT2 is formed by a n channel type transistor.

Both the fourth switching element BCT3 and sixth switching element BCT2 are controlled by a control signal (amplitude VGH/VGL) of the third scanning signal line BG. Since the first power supply line PVH and third power supply line PVD are both connected to the source of the drive transistor DRT, it is not preferable that different voltage levels are applied from these two power supply lines. Therefore, the fourth switch element BCT3 and sixth switching element BCT2 are configured to perform an exclusive operation. That is, when the fourth switching element BCT3 is formed by a first conductive type transistor, the sixth switching element BTC2 is formed by a second conductive type transistor the reverse of the first conductive type. FIG. 3 shows the case where the fourth switching element BCT3 is formed by a p channel type transistor and the sixth switching element BTC2 is formed by a n channel type transistor. In this way, even when the same control signal (amplitude VGH/VGL) is applied from the third power supply line BG to the fourth switching element BCT3 and sixth switching element BTC2, it is possible to ensure that both switching elements are not ON at the same time.

Figure 4:
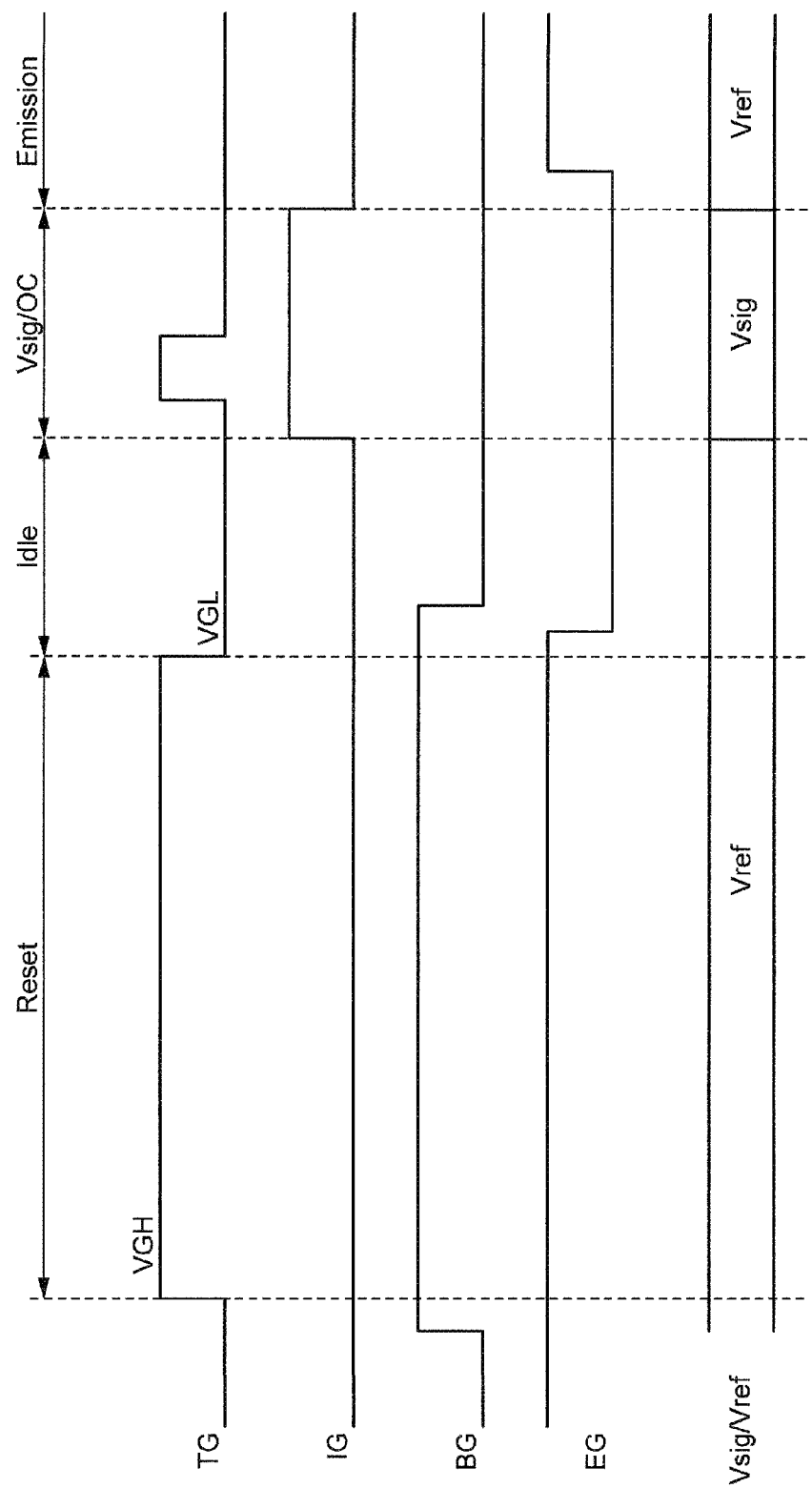
FIG. 4 is a timing chart for explaining a driving method of a display device related to one embodiment of the present invention.

A current which flow to the light emitting element EMD is controlled by the drive transistor DRT. A fifth switching element EMT is arranged between one terminal (anode) of the light emitting element EMD and one terminal (drain) of the drive transistor DRT. The fifth switching element EMT controls an electrical connection between one terminal (anode) of the light emitting element EMD and one terminal (drain) of the drive transistor DRT. An ON/OFF operation of the fifth switching element EMT is controls by a control signal (amplitude VGH/VGL) of the fourth scanning signal line EG. FIG. 4 shows an example where the fifth switching element is formed by a n channel type transistor. When the fifth switching element EMT is ON, a drain current flows from the drive transistor DRT to the light emitting element EMD and light is emitted.

The drive transistor DRT controls the amount of current which flows to the light emitting element EMD, and the fifth switching element EMT functions as a switching element for controlling the timing when the light emitting element EMD emits light. By arranging a fifth switching element EMT having such as function, it is possible to control the light emitting timing for each pixel.

In the pixel 104 shown in FIG. 3, the first power supply line PVH is arranged corresponding to a column direction with respect to at least the arrangement of a pixel. In addition, the first power supply line PVH may be arranged in a mesh shape in a row direction and a column direction with respect to the arrangement of a pixel. In this way, it is possible to apply the first voltage PVDD_H uniformly to each pixel within a pixel region. Thereby it is possible to achieve a uniform image display.

2-2. Operation of a Display Device (Example 1)

Next, the operation of the pixel shown in FIG. 3 is explained. The display device 100 is driven including at least three time periods, a reset time period, a signal writing and offset cancel time period and a light emitting time period. An idle time period during which a waveform of a control signal applied to a scanning line shifts may be included between the reset time period and signal writing and offset cancel time period.

FIG. 4 shows a timing chart of a first scanning signal line TG, second scanning signal line IG, third scanning signal line BG and fourth scanning signal line EG. In addition, a data signal Vsig (herein a voltage based on a data signal is also called "data voltage Vsig") which is applied to a first signal line VS and a reference signal Vref (herein a voltage based on reference signal is also called "reference voltage Vref") which is applied to a second signal line VR synchronized with a control signal of these scanning lines are also shown.

Figure 5:
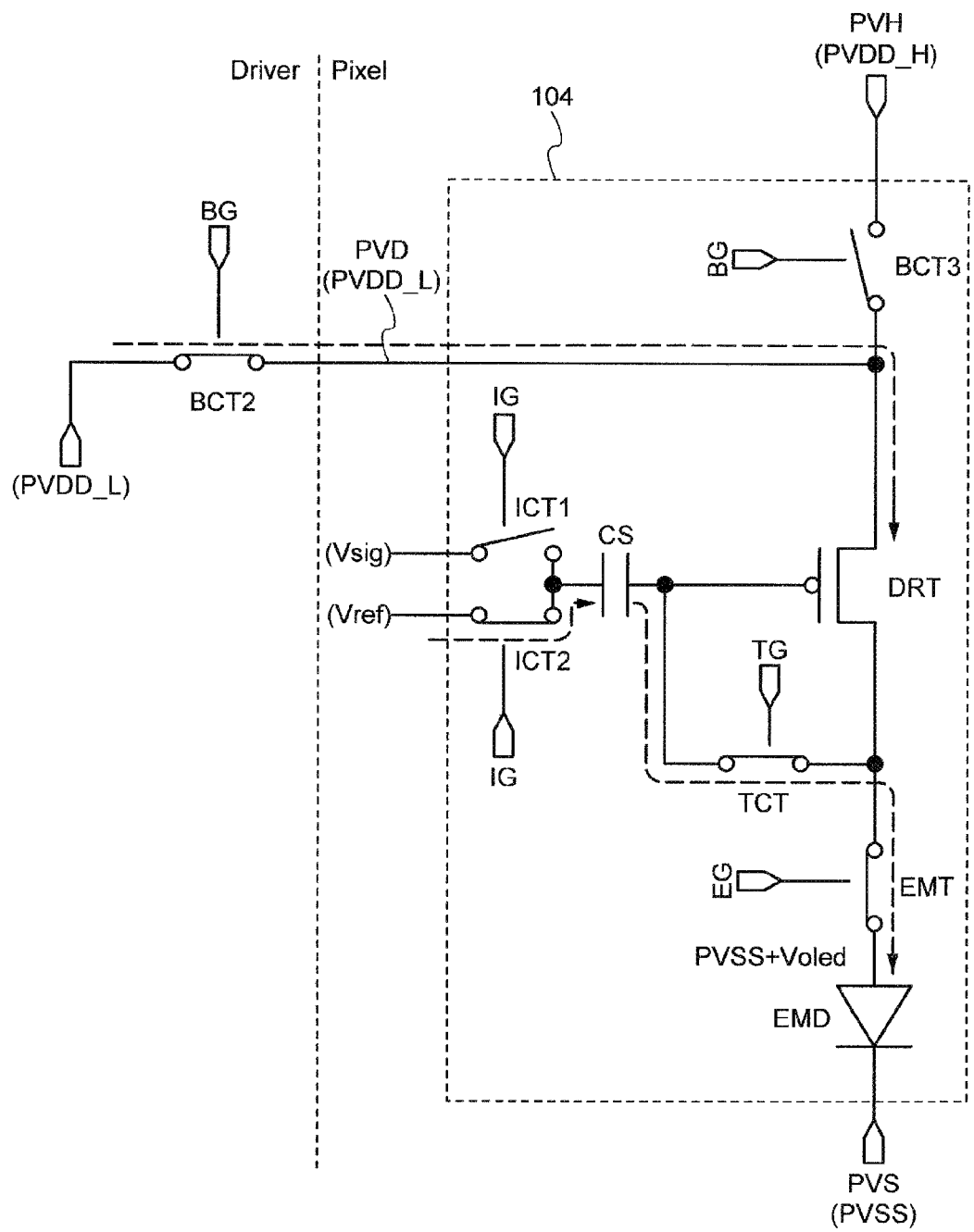
FIG. 5 is a circuit diagram for explaining a driving method of a display device related to one embodiment of the present invention.

In a reset time period, a storage capacitor element is discharged and charged with a reference voltage Vref is charged. The state of a pixel circuit at this time is shown in FIG. 5. Furthermore, FIG. 5 shows the first switching element TCT, second switching element ICT1, third switching element ICT2, fourth switching element BCT3, fifth switching element EMT and sixth switching element BCT2 using switch symbols for simplification.

A control signal (amplitude VGH/VGL) of the first scanning signal line TG becomes a high level voltage (amplitude VGH) and the first switching element TCT is turned ON. A control signal (amplitude VGH/VGL) of the second scanning signal line IG is a low level voltage (amplitude VGL) and the second switching element ICT1 is turned OFF, the third switching element ICT is turned ON, and the other terminal of the storage capacitor element CS is connected with the second signal line VR and is applied with a reference voltage Vref.

A control signal (amplitude VGH/VGL) of the fourth scanning signal line EG is a high level voltage (amplitude VGH) and the fifth switching element EMT is turned ON. One terminal of the storage capacitor element CS becomes connected with the second power supply line PVS via the first switching element TCT, fifth switching element EMT and light emitting element EMD. In this way, the charge (charge charged in the previous frame) charged in the storage capacitor element CS is discharged.

The storage capacitor element CS is discharged until a voltage of one terminal of the light emitting element EMD (terminal on the side connected with the drain of the drive transistor DRT) converges to a voltage (PVSS+Vem) obtained by adding a threshold voltage Vem of the light emitting element EMD to the second voltage PVSS. The control signal (amplitude VGH/VGL) of the third scanning signal line is a high level voltage (amplitude VGH), the third switching element BCT3 is turned OFF, the sixth switching element BCT2 is turned ON, and a third voltage PVDD_L is applied from the third power supply line PVD to the source of the drive transistor DRT. In this way, the source and drain of the drive transistor DRT are reset to the same voltage, namely the third voltage PVD_L. In a reset time period, since the storage capacitor element CS is connected to the second signal line VR and charged with a reference voltage Vref, the data of a data signal written in the previous frame is deleted.

Figure 6:
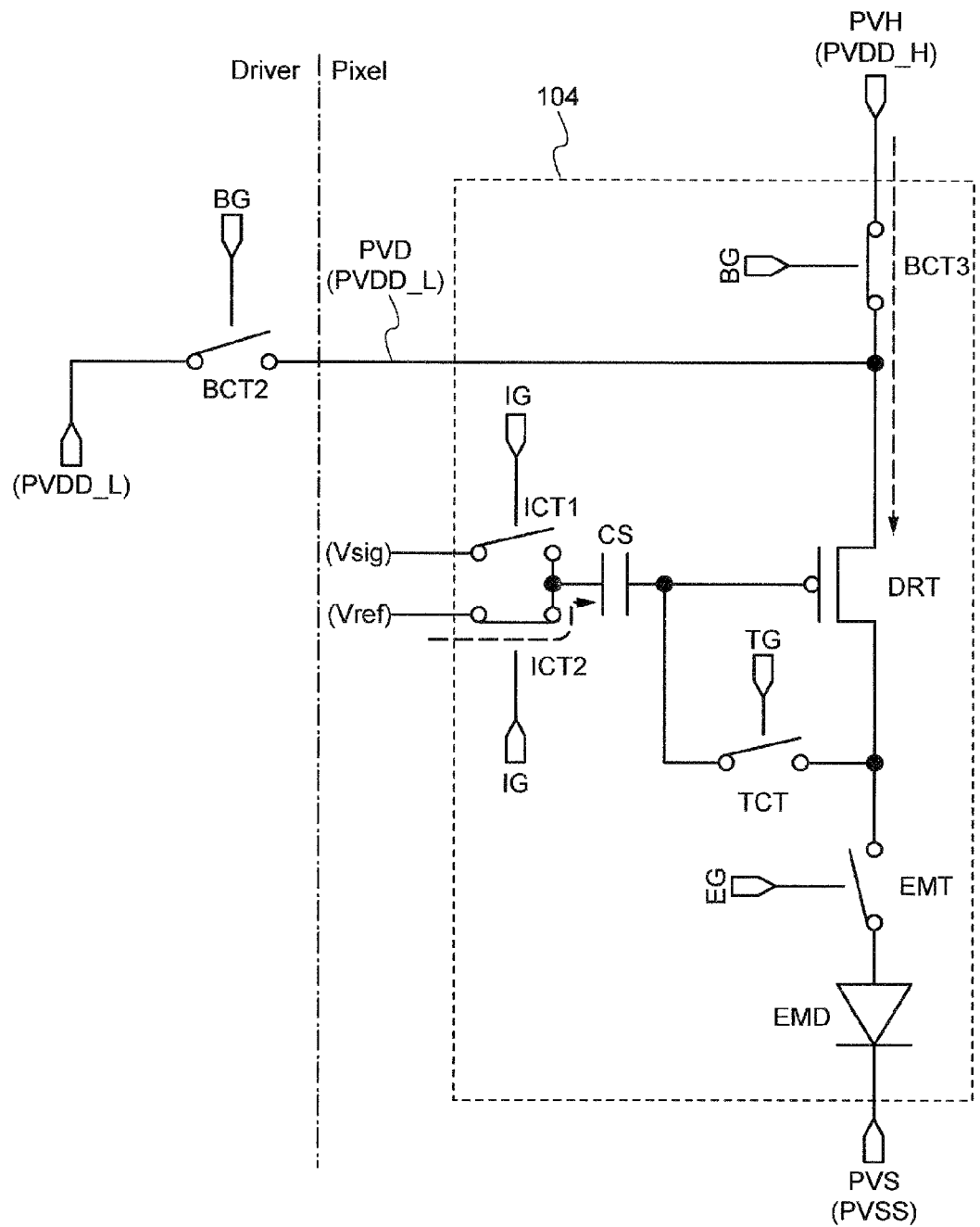
FIG. 6 is a circuit diagram for explaining a driving method of a display device related to one embodiment of the present invention.

In an idle time period, the storage capacitor element CS is separated from the second power supply line PVS, and a first voltage PVDD_H is applied to the source of the drive transistor DRT. The state of a pixel circuit at this time is shown in FIG. 6. A control signal (amplitude VGH/VGL) of the first scanning signal line TG becomes a low level voltage (amplitude VGL), and the first switching element TCT is turned OFF. A control signal (amplitude VGH/VGL) of the second scanning signal line IG is a low level voltage (amplitude VGL), the second switching element ICT1 is turned OFF, the third switching element ICT2 is turned ON, and a state in which a reference voltage Vref is applied from the second signal line VR to one terminal of the storage capacitor element CS is maintained.

A control signal (amplitude VGH/VGL) of the fourth scanning signal line EG changes to a low level voltage (amplitude VGL) from a high level and the first switching element TCT changes from ON to OFF. In this way, the connection between the drive transistor DRT and the light emitting element EMD is broken. Following this, a control signal (amplitude VGH/VGL) of the third scanning signal line BG changes to a low level voltage (amplitude VGL) from a high level, the sixth switching element BC2 is turned OFF, and the third switching element is turned ON. In this way, a first voltage PVDD_H is applied from the first power supply line PVH to the source of the drive transistor DRT.

Figure 7:
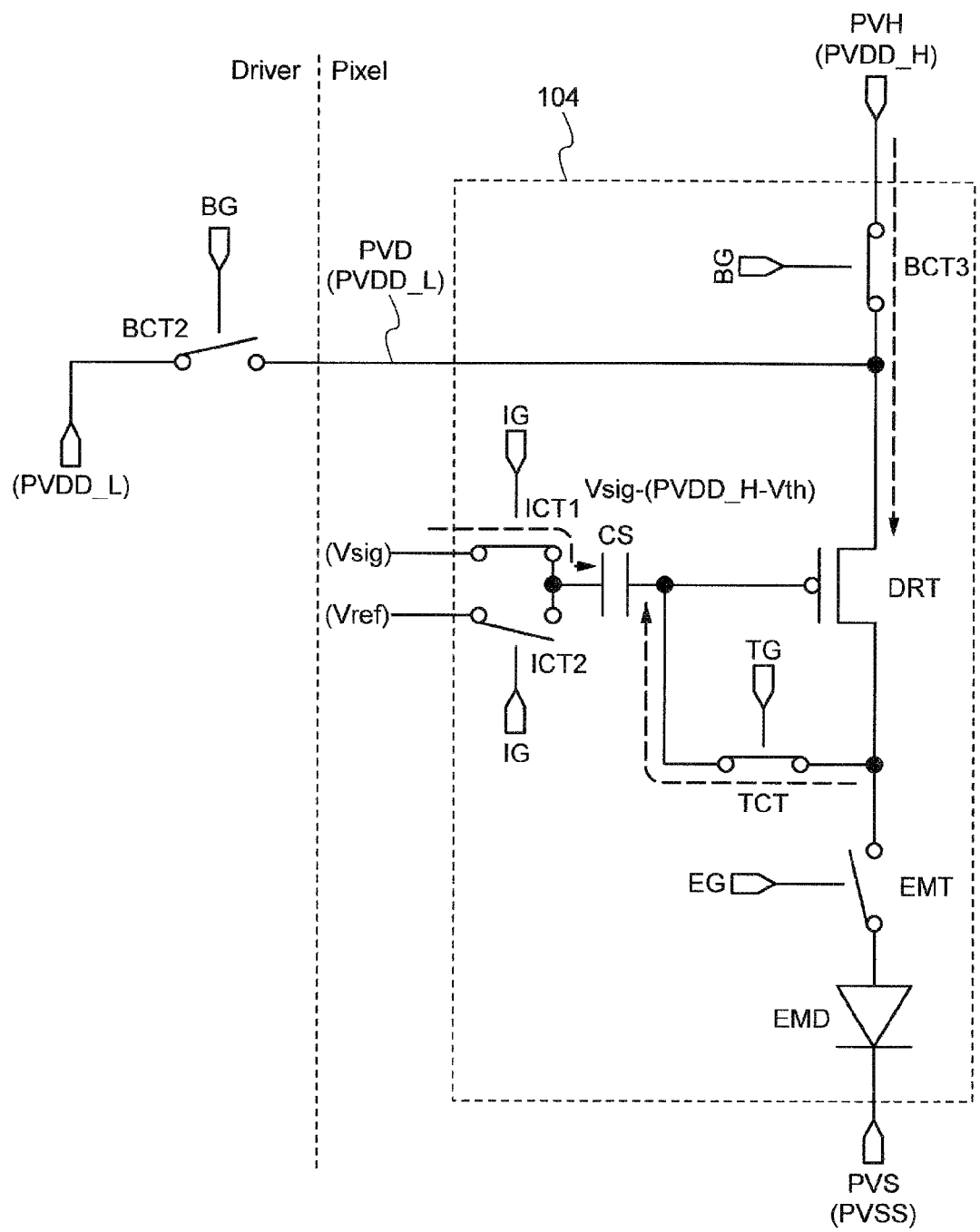
FIG. 7 is a circuit diagram for explaining a driving method of a display device related to one embodiment of the present invention.

In a signal writing and offset cancel time period, an operation for compensating a threshold voltage Vth of the drive transistor DRT is performed, and a data signal is written to the storage capacitor element CS. The state of a pixel circuit at this time is shown in FIG. 7. A control signal (amplitude VGH/VGL) of the second scanning signal line IG changes from a lower level to a high level voltage (amplitude VGH), the second switching element ICT1 is turned ON, the third switching element ICT2 is turned OFF, and a data voltage Vsig is applied from the first signal line VS to the other terminal of the storage capacitor element CS.

Following this, a control signal (amplitude VGH/VGL) of the first scanning signal line TG becomes a high level voltage (amplitude VGH), and the first switching element TCT is turned ON. In this way, the drain and gate of the drive transistor DRT are in a conducting state. A control signal (amplitude VGH/VGL) of the third scanning signal line BG is a low level voltage (amplitude VGL), the third switching element BCT3 is turned ON, and the sixth switching element BCT2 is turned OFF. In this way, a first voltage PVDD_H is applied from the first power supply line PVH to the source of the drive transistor DRT.

A control signal (amplitude VGH/VGL) of the fourth scanning signal line EG is an initial low level voltage (amplitude VGH), and the fifth switching element EMT is in an OFF state. In this way, the drain of the drive transistor DRT converges to a voltage (PVDD_H–Vth) obtained by reducing a threshold voltage Vth from the first voltage PVDD_H. Since a data voltage Vsig is applied from the first signal line VS to the storage capacitor element CS, the voltage between both terminals of the storage capacitor element CS becomes Vsig–(PVDD_H–Vth). At this time, since the fifth switching element EMT is OFF, a voltage above a light emitting threshold voltage is not applied to the light emitting element EMD to obtain a non-light emitting state.

Figure 8:
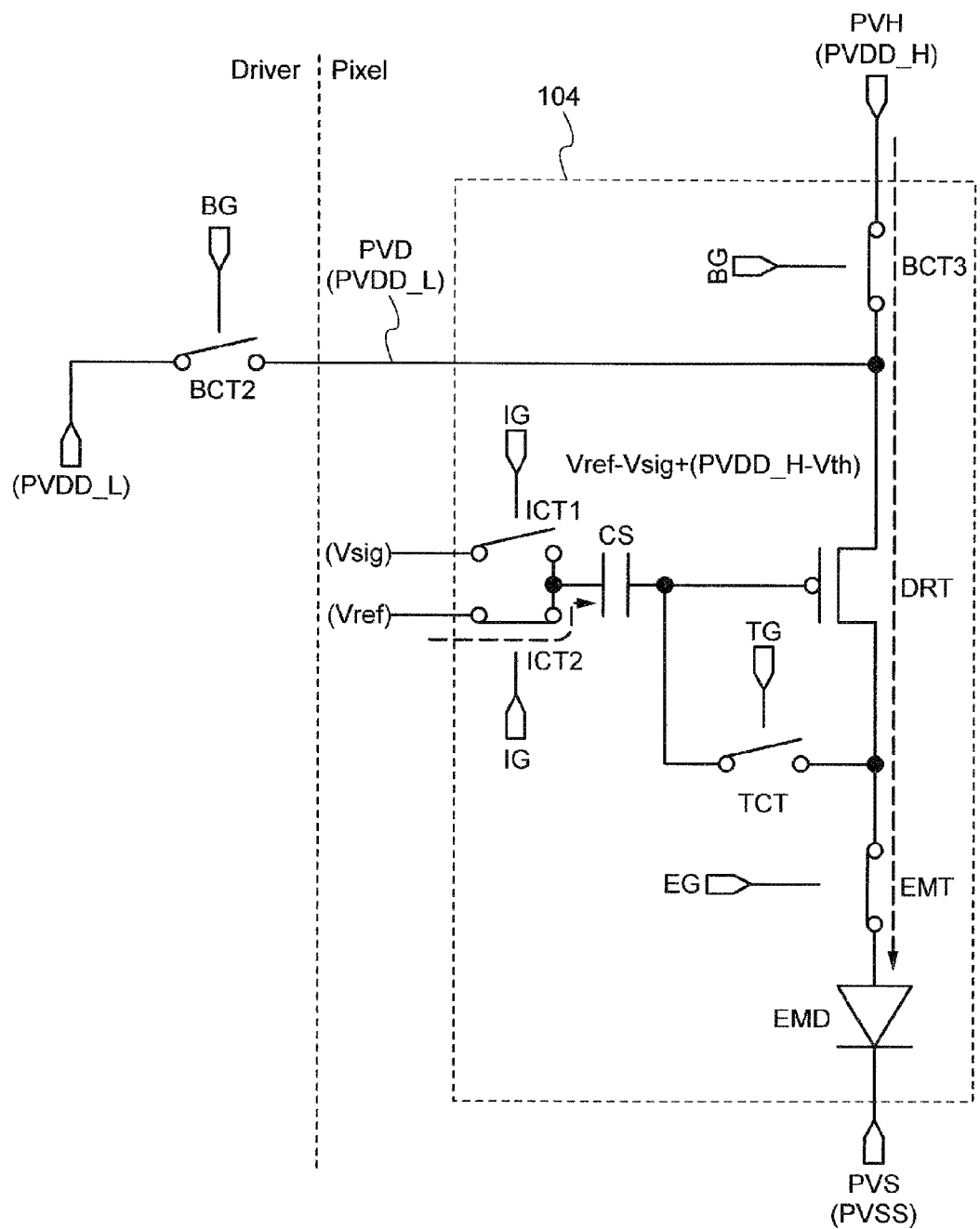
FIG. 8 is a circuit diagram for explaining a driving method of a display device related to one embodiment of the present invention.

In a light emitting period, light is emitted at an intensity depending on the amount of a drain current flowing from the drive transistor DRT to the light emitting element EMD. The stat of a pixel circuit at this time is shown in FIG. 8. A control signal (amplitude VGH/VGL) of the first scanning signal line TG changes from a high level to a low level voltage (amplitude VGL), and the first switching element TCT is turned to OFF. A control signal (amplitude VGH/VGL) of the second scanning signal line IG changes from a high level to a low level voltage (amplitude VGL), and the second switching element ICT1 is turned to OFF, the third switching element ICT2 is turned to ON, and a reference voltage Vref is applied to the other terminal of the storage capacitor element CS. In this way, the voltage of the storage capacitor element becomes Vref–Vsig+(PVDD_H–Vth).

A control signal (amplitude VGH/VGL) of the third scanning signal line BG is a high level (amplitude VGH), the fourth switching element BCT3 is turned to ON, and the sixth switching element BCT2 is turned to OFF. In this way, the first voltage PVDD_H is applied from the first power supply line PVH to the source of the drive transistor DRT. In addition, a control signal (amplitude VGH/VGL) of the fourth scanning signal line EG changes from a low level to a high level voltage (amplitude VGH), and the fifth switching element EMT is turned to ON. A drain current controlled by the gate voltage of the drive transistor DRT flows and the light emitting element EMD emits light. Since the substantial gate voltage of the drive transistor DRT becomes Vref–Vsig, any influence of the threshold voltage Vth is cancelled.

By providing the display device 100 related to one embodiment of the present invention with a reset time period in which the first switching element TCT and the fifth switching element EMT are ON, the fourth switching element BCT3 is turned OFF, a reference voltage Vref is applied from the second signal line VR via the third switching element ICT2 to the storage capacitor element CS, and a third voltage PVDD_L is applied to the other input/output terminal of the drive transistor DRT from the third power supply line PVD, a signal writing and offset cancel time period in which the first switching element TCT and the fourth switching element BCT3 are ON, the fifth switching element EMT is turned OFF, a voltage based on a data signal Vsig is supplied from the first signal line VS via the second switching element ICT1 to the other terminal of the storage capacitor element CS, and a first voltage PVDD_H is applied to the other input/output terminal of the drive transistor DRT from the first power supply line PVH, and a light emitting time period in which the first switching element TCT is OFF, the fourth switching element BCT3 and fifth switching element EMT are turned ON, a reference voltage Vref is applied from via the third switching element ICT2 to the other terminal of the storage capacitor element CS, and a current flows via the drive transistor DRT from the first power supply line PVH and the light emitting element emits light, thereby it is possible to provide a display without receiving the effects of a variation in a threshold voltage of a drive transistor DRT. In addition, the display device 100 can display an image with no variation in luminosity in a surface (especially in a horizontal direction) of the pixel region 102.

By applying the first voltage PVDD_H which is a high voltage to the source of the drive transistor DRT and turning the fifth switching element EMT OFF, a voltage on the drain side of the drive transistor DRT converges to a voltage obtained by reducing a threshold voltage Vth from the first voltage PVDD_H within an offset cancel time period for obtaining the threshold voltage Vth and securely perform an offset cancel operation. By performing an offset cancel operation using the first voltage PVDD_H which is a high voltage, it is possible to securely compensate for a threshold voltage of the drive transistor DRT even in the case where the number of pixels increases and an offset cancel time period allowed within one frame time period is shortened. Furthermore, by arranging power supply lines in a mesh shape, it is possible to relieve the effects of a drop in voltage due to wire resistance of a power supply line and reduce offset cancel variation within the pixel region 102. Furthermore, since the fifth switching element EMT is OFF, a large current does not flow via a power supply line within an offset cancel time period, the effects of a drop in voltage due to wire resistance are relieved, and it is possible to reduce offset cancel variation within the pixel region 102.

The first power supply line PVH applies the first voltage PVDD_H to each pixel within a light emitting time period. That is, the light emitting element EMD is supplied with a drive current from the first power supply line PVH via the drive transistor DRT. By arranging the power supply lines in a mesh shape as described above, the effects of a drop in voltage due to wire resistance are relieved and a variation in light emitting intensity within the pixel region 102 is reduced.

2-3. Modified Example 1

Figure 9:
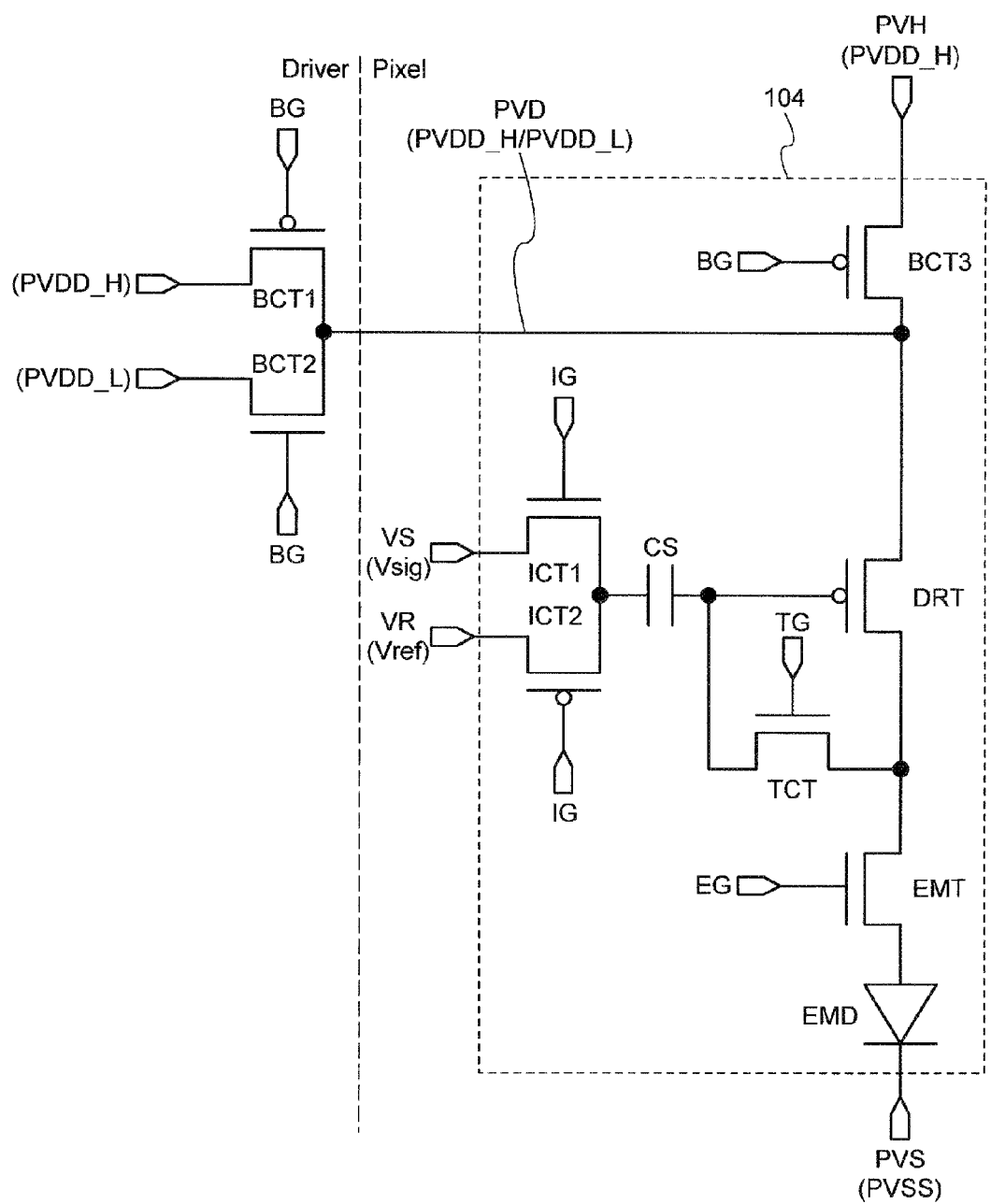
FIG. 9 is a circuit diagram showing a circuit structure of a pixel in a display device related to one embodiment of the present invention.

As in the pixel 104b shown in FIG. 9, in addition to the sixth switching element BCT2, a seventh switching element BCT1 may be connected in parallel to the third power supply line PVD and the first voltage PVDD_H may be applied. That is, a power supply voltage applied to the third power supply line PVD can be switched and control of this switching may be performed by the sixth switching element BCT2 and seventh switching element BCT1 arranged in a drive circuit. One terminal of the sixth switching element BCT2 and seventh switching element BCT1 is electrically connected with the third power supply line PVD. The other terminal which is the signal input side of the sixth switching element BCT2 is applied with the third voltage PVDD_L, and the other terminal which is the signal input side of the seventh switching element BCT2 is connected with the first voltage PVDD_H.

Here, the sixth switching element BCT2 and seventh switching element BCT1 operate exclusively. That is, when the same control signal (amplitude VGH/VGL) of the third scanning signal line BG is applied, one of the sixth switching element BCT2 and seventh switching element BCT1 is turned ON and the other is turned OFF. In order to realize this type of operation, in the case where the sixth switching element BCT2 is formed by a first conductive type transistor, the seventh switching element BTC1 is formed by a conductive type transistor the reverse of the first conductive type. FIG. 3 shows the case where the sixth switching element BCT2 is formed by a n channel type transistor and the seventh switching element BCT1 is formed by a p channel type transistor.

The fourth switching element BCT3, sixth switching element BCT2 and seventh switching element BCT1 are all controlled by a control signal (amplitude VGH/VGL) of the third scanning signal line BG. Since the third power supply line PVD and first power supply line PVH are both connected to the source of a drive transistor DRT, it is not preferable that voltages with different levels are applied from these power supply lines. In the present embodiment, while the sixth switching element BCT2 is turned ON when a third voltage PVDD_L is applied, the fourth switching element BCT3 and seventh switching element BCT1 which are turned ON when a first voltage PVDD_H is applied are formed by different conductive type transistors. In this way, it is possible to ensure that both switching elements are not turned ON at the same time even when the same control signal (amplitude VGH/VGL) is applied to the fourth switching element BCT3 and sixth switching element BCT2 from the third scanning signal line BG. FIG. 3 shows an example in which the fourth switching element BCT3 and seventh switching element BCT1 are formed using a p channel type transistor and the sixth switching element BCT2 is formed using a n channel type transistor.

As is shown in FIG. 3, a drive transistor DRT is electrically connected with a third power supply line PVD which extends in a row direction, and a first power supply line PVH which extends in a column direction via a switching element. That is, the third power supply line PVD extending in a row direction is connected to a source of the drive transistor DRT via the seventh switching element BCT1, and the first power supply line PVH is connected with the source of the drive transistor DRT via the fourth switching element BCT3. In this way, in an offset cancel time period, a first voltage PVDD_H is applied from the first power supply line PVH and third power supply line PVD.

That is, it is possible to operate the pixel 104b shown in FIG. 9 so that by connecting the seventh switching element BCT1 in parallel and applying the first voltage PVDD_H to the third power supply line PVD, in the signal writing and offset cancel time period, the first switching element TCT and fourth switching element BCT3 are turned ON, the fifth switching element EMT is turned OFF, a voltage based the data signal Vsig is supplied from the first signal data line VS via the second switching element ICT1 to the other terminal of the storage capacitor element CS, and the first voltage PVDD_H is applied to the other input/output terminal of the drive transistor DRT from the first power supply line PVH and third power supply line PVD, and in a light emitting time period, the first switching element TCT is turned OFF, the fourth switching element BCT3 and fifth switching element EMT are turned ON, a reference voltage Vref is applied via the third switching element ICT2 to the other terminal of the storage capacitor element CS, a current flows from the first power supply line PVH and third power supply line PVD via the drive transistor DRT and the light emitting element EMD emits light.

The first power supply line PVH and third power supply line PVD apply the first voltage PVDD_H to each pixel in a light emitting time period. That is, the light emitting element EMD is supplied with a drive current from the first power supply line PVH and third power supply line PVD via the drive transistor DRT. By arranging the power supply lines in a mesh shape as described above, the effects of a drop in voltage due to wire resistance are relieved and a variation in light emitting intensity within the pixel region 102 is reduced.

2-4. Modified Example 2

After an offset cancel time period which compensates for a threshold voltage of a drive transistor DRT, a low level voltage VGL1 of a first scanning signal line TG is conventionally been required to be a very low level voltage in order to turn the first switching element TCT OFF. However, such a low level voltage VGL1 creates a large reverse bias state in the first switching element TCT in a light emitting time period, and a problems sometimes occurs where a leak current flows from the drain of the drive transistor DRT. As a result, a problem occurs whereby the drain current of the drive transistor DRT increases and luminosity of the light emitting element EMD increases. That is, it is feared that a problem may occur in which light spot defects are produced in a pixel region 102.

Figure 10:
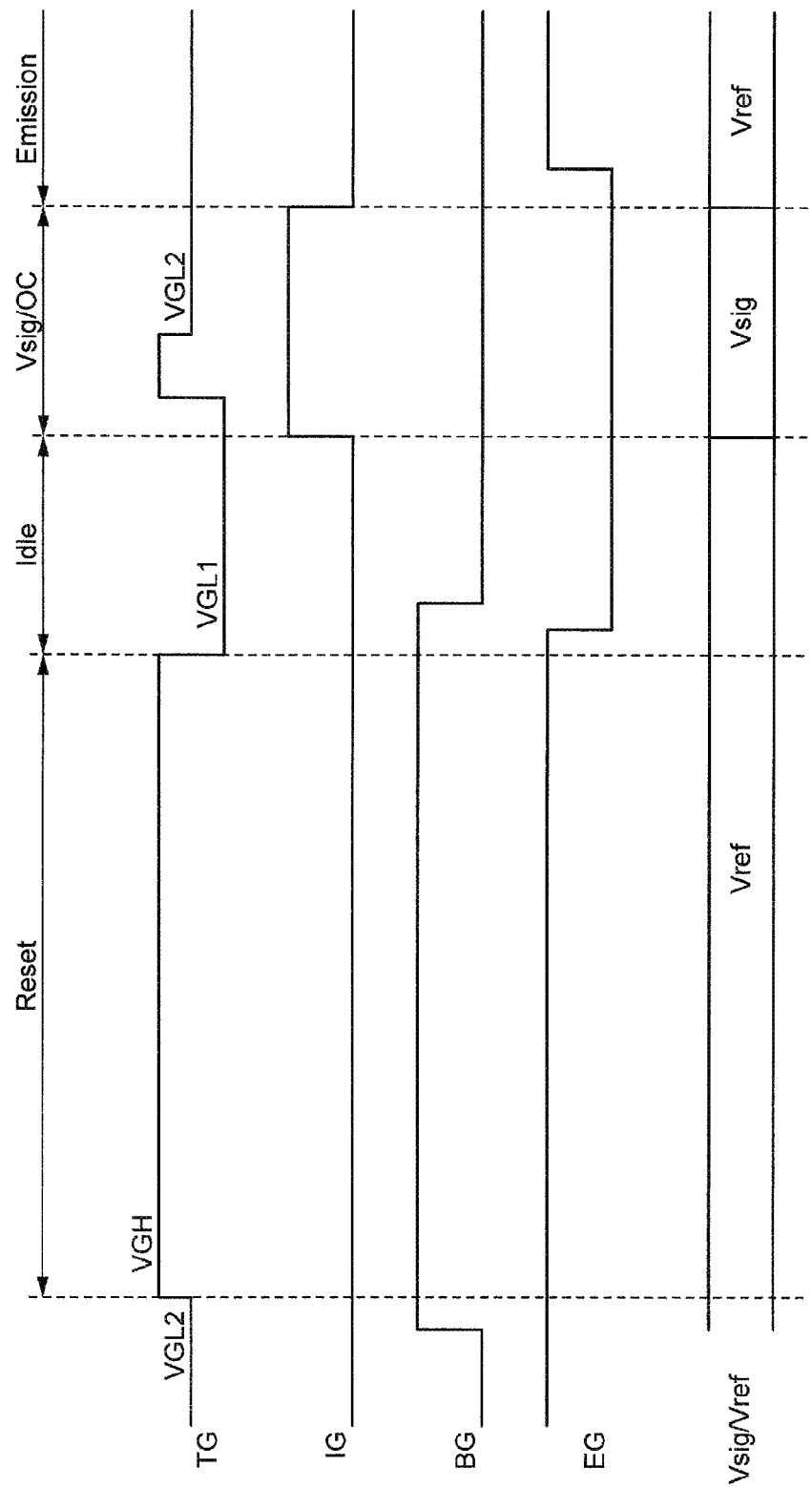
FIG. 10 is a timing chart for explaining a driving method of a display device related to one embodiment of the present invention.

FIG. 10 shows an example in which an intermediate voltage VGL2 is added in addition to a high level voltage VGH and a low level voltage VGL1, and a control signal of the first scanning signal line TG drives a first switching element using the three level signals. After the signal writing and offset cancel time period, a voltage of the first scanning signal line TG is set to a lower voltage VGL2 than a high level voltage VGH and higher than the low level voltage VGL1, thereby, the gate of the first switching element TCT is applied with a higher voltage than a normal OFF state. In this way, in a light emitting time period, a reverse bias state of the first switching element TCT is relieved and it is possible to reduce a leak current. Furthermore, the low level voltage VGL2 is a voltage which can maintain an OFF state of the first switching element TOT.

By driving the first switching element TCT using three level waveforms as is shown in FIG. 10, it is possible to continue to compensate for a threshold voltage of a drive transistor DRT and prevent the generation of light spots in a light emitting time period.

3-1. Circuit Structure of a Pixel (Example 2)

In the pixel 104 shown in FIG. 3, the fourth switching element BCT3 which controls the connection between the first power supply line PVH and drive transistor DRT can be shared between a plurality of pixels. That is, it is possible to share the fourth switching element BCT3 which controls the connection with the first power supply line PVH between pixels adjacent in a row direction and/or a column direction.

Figure 11:
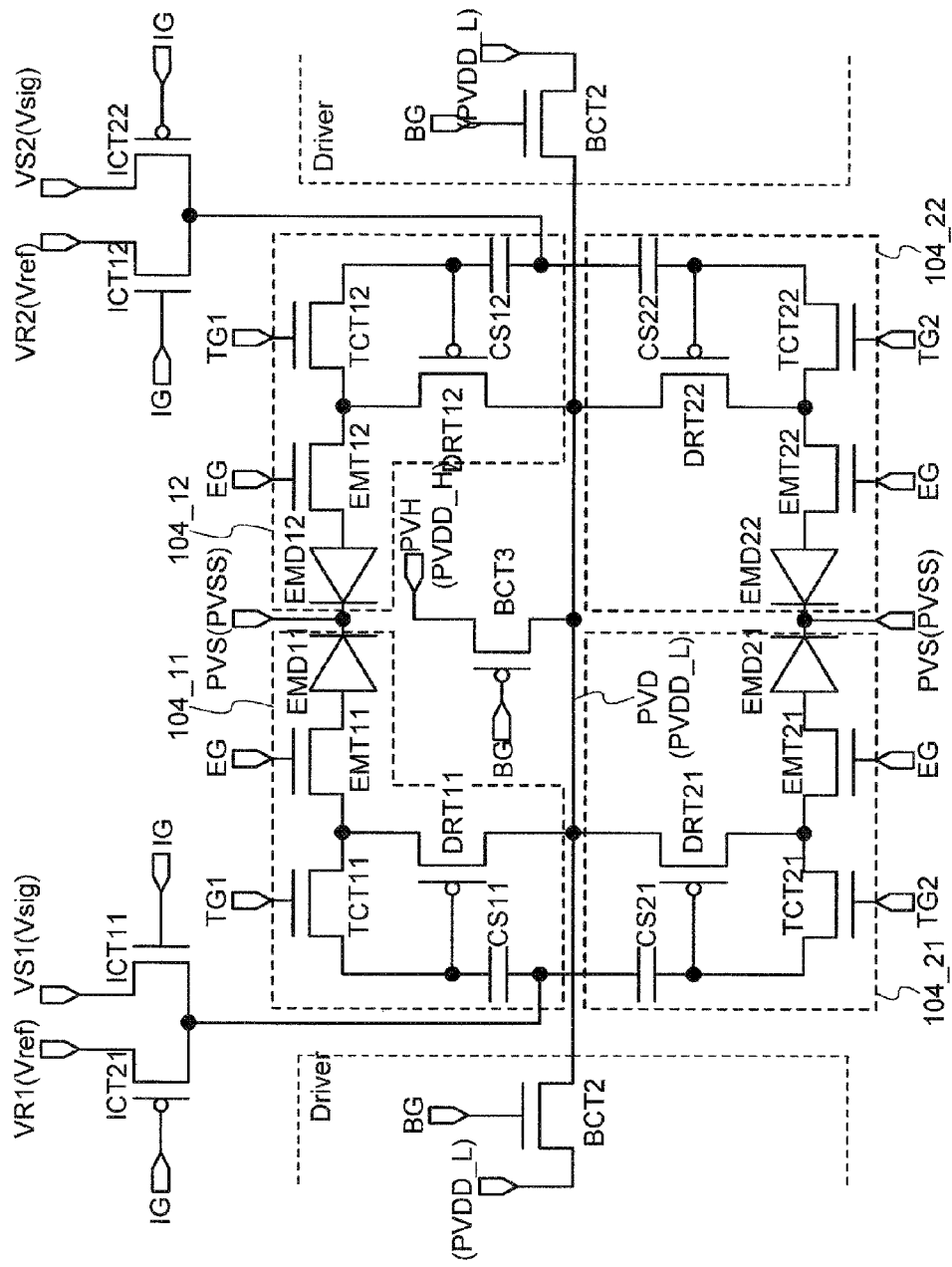
FIG. 11 is a diagram showing a circuit structure in a pixel region of a display device related to one embodiment of the present invention.

FIG. 11 shows an example in which the fourth switching element BCT3 is shared between four pixels (first pixel 104_11, second pixel 104_12, third pixel 104_21 and fourth pixel 104_22) arranged in a row direction and column direction. A drive transistor DRT11, light emitting element EMD 11, storage capacitor element CS11, first switching element TCT11 and fifth switching element EMT11 are included in the first pixel 104_11. The same is true for the second pixel 104_12, third pixel 104_21 and fourth pixel 104_22.

The second switching element ICT11 and third switching element ICT21 which are connected with the other terminal of the storage capacitor element CS11 of the first pixel 104_11 are arranged to be shared with the third pixel 104_21. This is also the same for the second switching element ICT12 and third switching element ICT22 with respect to the second pixel 104_12 and fourth pixel 104_22. That is, the second switching element ICT11 which controls the connection between the storage capacitor element CS11, storage capacitor element CS21 and first signal line VS1, and the third switching element ICT21 which controls the connection with the second signal line VR1 can be shared between a plurality of pixels. In this way, by sharing the second switching element ICT11 and third switching element ICT21, and the second switching element ICT12 and third switching element ICT22 between pixels adjacent in a column direction, it is possible to substantially reduce the number of transistors per pixel.

The first power supply line PVH is connected to the four pixels (first pixel 104_11, second pixel 104_12, third pixel 104_21 and fourth pixel 104_22) via the fourth switching element BCT3 and the third power supply line PVD is connected to the four pixels via the sixth switching element BCT2. By arranging the fourth switching element BCT3 to be shared between a plurality of pixels, it is possible to substantially reduce the number of transistors per pixel. This type of structure is useful it terms of miniaturizing pixels and achieving high definition.

Furthermore, as explained referring to FIG. 3, the seventh switching element BCT1 may be connected in parallel with the sixth switching element BCT2 and the first voltage PVDD_H can be applied to the third power supply line PVD. In this way, it is possible to achieve further uniformity in a luminosity distribution in a horizontal direction.

3-2. Operation of a Display Device (Example 2)

Figure 12:
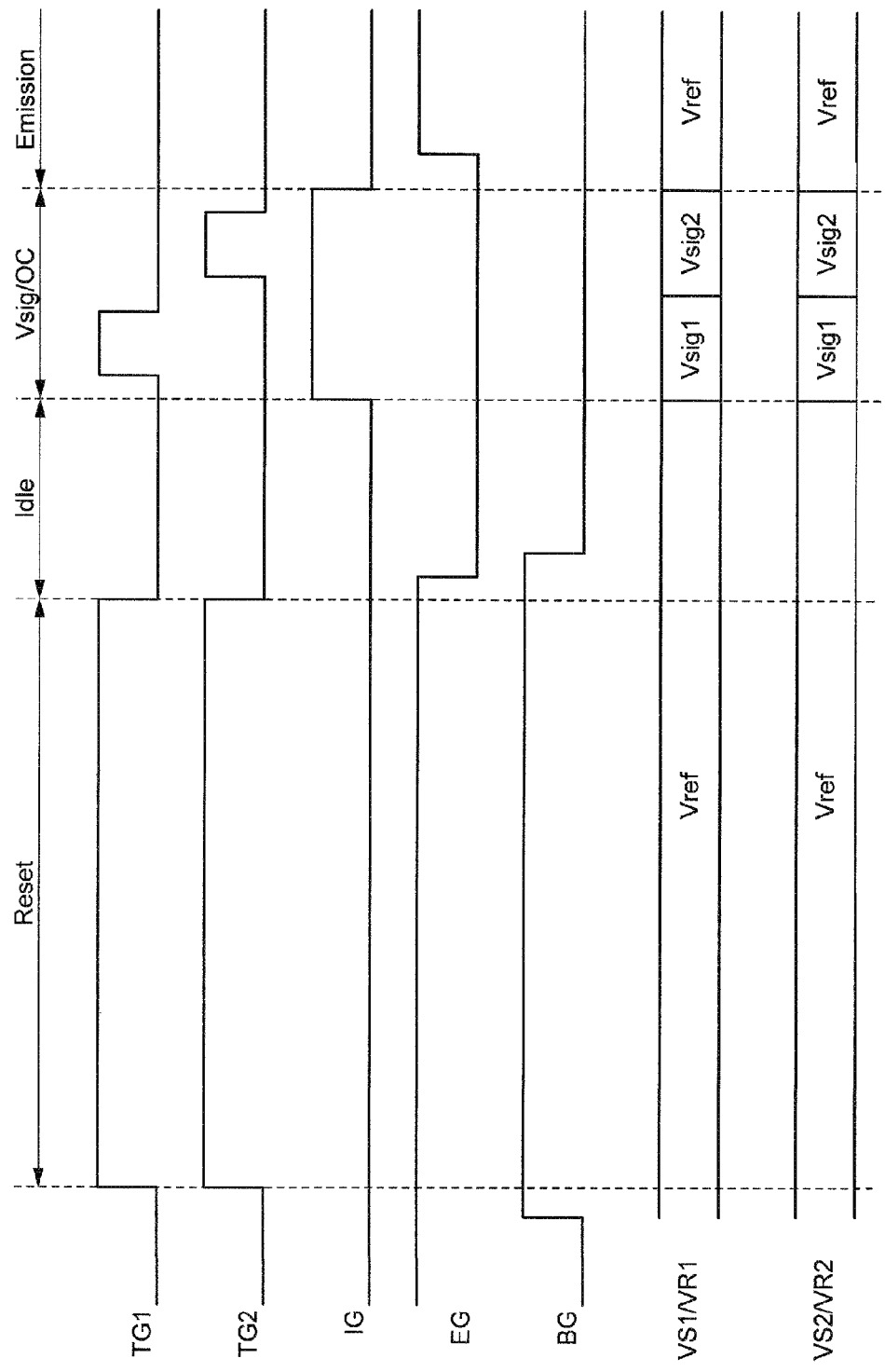
FIG. 12 is a timing chart for explaining a driving method of a display device related to one embodiment of the present invention.

FIG. 12 shows a timing chart for explaining the operation of the four pixels (first pixel 104_11, second pixel 104_12, third pixel 104_21 and fourth pixel 104_22) shown in FIG. 11.

In a reset time period, a control signal (amplitude VGH/VGL) of the first scanning signal line TG1 and a control signal (amplitude VGH/VGL) of the second scanning signal line TG2 become a high level voltage (amplitude VGH), and the first switching element TCT11, first switching element TCT12, first switching element TCT21 and first switching element TCT22 are turned ON.

A control signal (amplitude VGH/VGL) of the second scanning signal line IG is a low level voltage (amplitude VGL), the second switching element ICT11 and the second switching element ICT12 are turned OFF, the third switching element ICT21 and the third switching element TCT22, are turned ON, one end of the storage capacitor element CS11 and storage capacitor element CS21 is connected with the second signal line VR1, one end of the storage capacitor element CS12 and storage capacitor element CS2 is connected with the second signal line VR2 and a reference voltage Vref is applied.

A control signal (amplitude VGH/VGL) of the fourth scanning signal line EG is a high level voltage (amplitude VGH) and the fifth switching element EMT11 to fifth switching element EMT22 are switched ON. In the first pixel 104_11, the other end of the storage capacitor element CS11 is in a state connected with the second power supply line PVS via the first switching element TCT11, fifth switching element EMT11 and light emitting element EMD11. This state is the same for the second pixel 104_12, third pixel 104_21 and fourth pixel 104_22. In this way, the charge charged in the storage capacitor element CS of each pixel is discharged. The discharge of a storage capacitor element CS in each pixel in a reset time period is the same as that explained using FIG. 4. Since a storage capacitor element CS in each pixel is connected to the second signal line VR and charged with a reference voltage Vref, the data of a data signal written in the previous frame is deleted.

In an idle time period, a control signal (amplitude VGH/VGL) of the first scanning signal line TG1 and a control signal (amplitude VGH/VGL) of the second scanning signal line TG2 become a low level voltage (amplitude VGL), and the first switching element TCT11, first switching element TCT12, first switching element TCT21 and first switching element TCT22 are turned OFF.

In addition, in the first pixel 104_11, the storage capacitor CS11 is separated from the third power supply line PVD, and the first voltage PVD_H is applied to the source of the drive transistor DRT11. A control signal (amplitude VGH/VGL) of the first scanning signal line TG1 becomes a low level voltage (amplitude VGL), and the first switching element TCT11 is turned OFF. A control signal (amplitude VGH/VGL) of the second scanning signal line IG remains as a low level voltage (amplitude VGL), the second switching element ICT11 is turned ON, the third switching element ICT21 is turned OFF, and a reference voltage Vref is applied from the second signal line VR1 to one terminal of the storage capacitor element CS11. A control signal (amplitude VGH/VGL) of the fourth scanning signal line EG changes from a high level to a low level voltage (amplitude VGL), and the fifth switching element EMT in each pixel changes from ON to OFF. Following this, a control signal (amplitude VGH/VGL) of the third scanning signal line BG changes from a high level to a low level voltage (amplitude VGL), the fourth switching element BCT3 is turned ON, and the sixth switching element BCT2 is turned OFF. This operation is also the same for the other pixels. In this way, the first voltage PVDD_H is applied to the source of a drive transistor DRT in each pixel.

In the first pixel 104_11 in the signal writing and offset cancel time period, a control signal (amplitude VGH/VGL) of the second scanning signal line IG changes from a low level to a high level voltage (amplitude VGH), the second switching element ICT11 is turned ON, the third switching element ICT21 is turned OFF, and a data voltage Vsig1 is applied from the first signal line VS1 to one terminal of the storage capacitor element CS11. A control signal (amplitude VGH/VGL) of the first scanning signal line TG1 becomes a high level voltage (amplitude VGH), and the first switching element TCT11 is turned ON. In this way, the drain and gate of the drive transistor DRT11 is in a conducting state. A control signal (amplitude VGH/VGL) of the third scanning signal line BG is a high level voltage (amplitude VGH), the third switching element BCT3 is turned ON, and the sixth switching element BCT2 is turned OFF. In this way, the first voltage PVDD_H is applied from the first power supply line PVH to the source of the drive transistor DRT11. A control signal (amplitude VGH/VGL) of the fourth scanning signal line EG remains as a low level voltage (amplitude VGL), and the fifth switching element EMT11 is maintained in an OFF state. In this way, the drain of the drive transistor DRT11 converges to a voltage obtained by reducing the threshold voltage from the first voltage PVDD_H (PVDD_H−Vth). Since a data voltage Vsig1 is applied from the first signal line VS to the storage capacitor element CS11, a voltage between both terminals of the storage capacitor element CS11 becomes Vsig1−(PVDD_H−Vth). This operation is also the same for the second pixel 104_12 which is provided with the same first scanning signal line TG1, the second switching element ICT21 is turned OFF<the third switching element ICT22 is turned ON, and a data voltage Vsig1 is applied from the first signal line VS2 to one terminal of the storage capacitor element CS12. That is, the first pixel 104_11 is supplied with a data signal from the first signal line VS1 and the second pixel 104_12 is supplied with a data signal from the first signal line VS2. Apart from this, the first pixel 104_11 and second pixel 104_12 perform the same operations.

Following this, in the first pixel 104_11, a control signal (amplitude VGH/VGL) of the first scanning signal line TG1 becomes a low level voltage (amplitude VGL), and the first switching element TC11 turned OFF. The same is true for the second pixel 104_12.

Next, with respect to the third pixel 104_21, a control signal (amplitude VGH/VGL) of the first scanning signal line TG2 becomes a high level voltage (amplitude VGH) from a low level, and the first switching element TCT21 is turned ON. In addition, the first voltage PVDD_H is applied from the first power supply line PVH to the drive transistor DRT21 the same as described above, a data voltage Vsig2 is applied from the first signal line VS1 to the storage capacitor element CS21, and the voltage between the terminals of the storage capacitor element CS21 becomes Vsig2−(PVDD_H−Vth). In the fourth pixel 104_22, a data voltage Vsig2 is applied from the first signal line VS2, and the voltage between the terminals of the storage capacitor element CS22 becomes Vsig2−(PVDD_H−Vth).

In this way, by switching the ON timing of the first switching element TG1 and first switching element TG2 in a signal writing and offset cancel time period, it is possible to write a necessary data voltage to each pixel together with switching a signal of a signal line from a data voltage Vsig1 to Vsig2 even when the first signal line VS and second signal line VR are shared between pixels 104 in a column direction.

In the first pixel 104_11 in a light emitting time period, a control signal (amplitude VGH/VGL) of the first scanning signal line TG1 changes to low level voltage (amplitude VGL) from a high level, and the first switching element TCT11 is turned OFF. A control signal (amplitude VGH/VGL) of the second scanning signal line IG changes to a low level voltage (amplitude VGL) from a high level, the second switching element ICT11 is turned OFF, the third switching element ICT21 is turned ON, and a reference voltage Vref is applied to one terminal of the storage capacitor element CS11. In this way, the voltage of the storage capacitor element CS11 becomes Vref−Vsig1+(PVDD_H−Vth). A control signal (amplitude VGH/VGL) of the third scanning signal line BG is a high level voltage (amplitude VGH), the fourth switching element BCT3 is turned ON, and the sixth switching element BCT2 is turned OFF. In this way, the first voltage PVDD_H is applied from the first power supply line PVH to the source of the drive transistor DRT11. In addition, a control signal (amplitude VGH/VGL) of the fourth scanning signal line EG changes to a high level voltage (amplitude VGH) from a low level, and the fifth switching element EMT11 is turned ON. In this way, a drain current controlled by the gate voltage of the drive transistor DRT11 flows to the light emitting element EMD11 and light is emitted. Since the gate voltage of the drive transistor DRT11 is substantially Vref−Fsig1, any effects of a threshold voltage Vth are cancelled. In this way, it is possible to provide a display without receiving any effects of a variation in a threshold voltage of the drive transistor DRT11. The operation in a light emitting time period is the same for the second pixel 104_12. In the third pixel 104_21 and fourth pixel 104_22, the gate voltage of the drive transistor DRT11 is essentially the same except for Vref−Vsig2.

As was explained while referring to FIG. 11, according to one embodiment of the present invention, it is possible to share the fourth switching element BCT3 which controls a connection with the first power supply line PVH which supplies the first voltage PVDD_H among a plurality of pixels, and it is possible to reduce the number of switching elements (transistors) necessary for forming a pixel circuit. In addition, it is possible to share the second switching element ICT1 and third switching element ICT2 which are used when writing a reference signal and data signal to a storage capacitor element among a plurality of pixels, and it is possible to reduce the number of switching elements (transistors) necessary for forming a pixel circuit. That is, as is shown in FIG. 12, by making the timing of an initial rise of two first operation signal lines TG1, TG2 different, it is possible to write data signals in sequence from the first signal line VS1 to the first pixel 104_11 and third pixel 104_21 adjacent in a column direction. In this case, since it is possible to share the second switching element ICT11 and third switching element ICT21, and fourth switching element BCT3 which select a connection of the first signal line VS1 and second signal line VR1 between these two pixels, it is possible to reduce the number of switching elements necessary for forming a pixel circuit.

Furthermore, in the structure of the pixel shown in FIG. 11, as explained as modified example 1, the seventh switching element BCT1 may be connected in parallel and the first voltage PVDD_H may be applied to the third power supply line PVD. In this way, it is possible to obtain the same operational effects as in the modified example 1.

In addition, in the structure of the pixel shown in FIG. 11, as explained as modified example 1, a three level control signal (amplitude VGH/VGL1/VGL2) may be applied to the first scanning signal line TG1 and first scanning signal line TG2 to control the first switching element TOT. In this way, it is possible to obtain the same operational effects as in the modified example 2.

4. Structure of a Pixel

Figure 13:
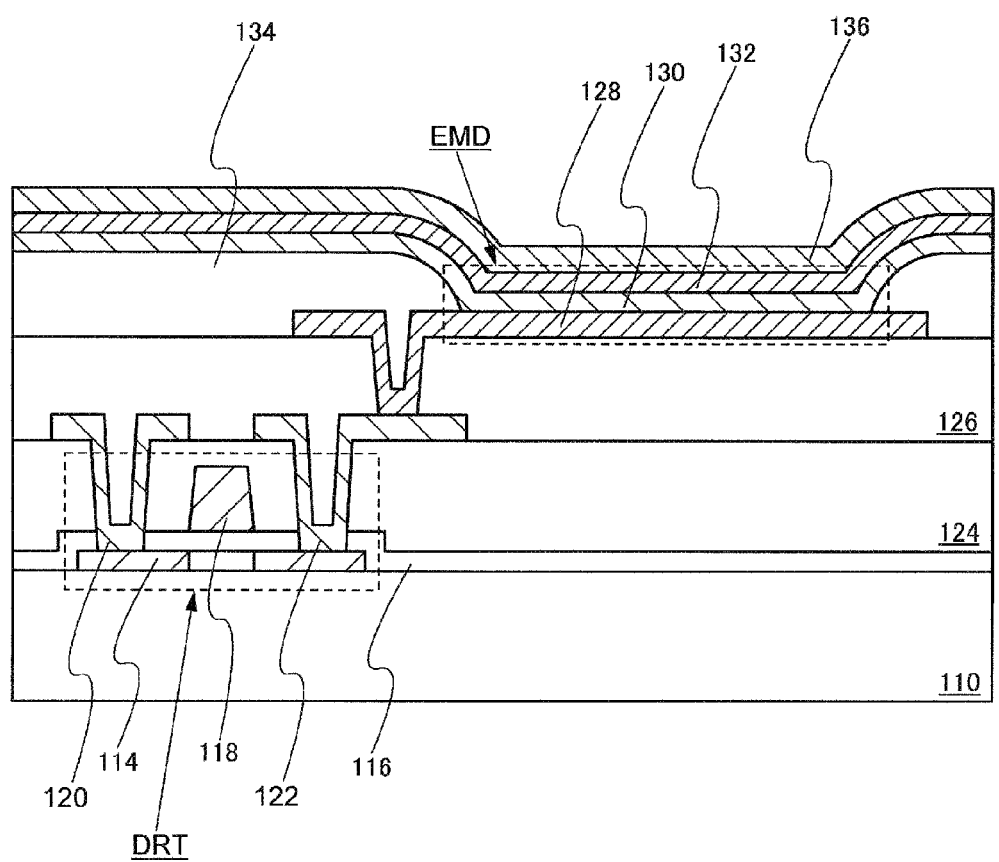
FIG. 13 is a cross-sectional diagram showing a structure of a part of a pixel that can be applied to one embodiment of the present invention.

FIG. 13 shows a cross-sectional diagram of a part of a structure of a pixel that can be applied to one embodiment of the present invention. FIG. 13 shows an example of a drive transistor DRT and light emitting element EMD. The drive transistor DRT is arranged in a first substrate 110. The drive transistor DRT is formed including a semiconductor layer 114, gate insulation layer 116 and gate electrode 118. The semiconductor layer 114 of the drive transistor DRT is formed from an amorphous or polycrystalline silicon semiconductor or oxide semiconductor using the semiconductor properties of a metal oxide. The drive transistor DRT is formed with a channel in a region where the semiconductor layer 114 overlaps with the gate electrode 118, and a source region and drain region are arranged so as to sandwich the channel.

A source electrode 120 and drain electrode 122 are arranged sandwiching a first interlayer insulation layer 124. The source electrode 120 and drain electrode 122 are each connected to a source region and a drain region of the semiconductor layer 114 through a contact hole formed in the first interlayer insulation layer 124 and gate insulation layer 116. A second interlayer insulation layer 126 is arranged above the source electrode 120 and drain electrode 122.

The light emitting element EMD includes a pixel electrode 128, light emitting layer 130 and opposing electrode 132. In one embodiment of the present invention, the pixel electrode 128 is an anode and the opposing electrode is a cathode. A bank layer 134 is arranged so as to enclose the pixel electrode 128. The light emitting layer 130 is arranged from the pixel electrode 128 to the bank layer 134. The light emitting layer 130 includes a light emitting material such as a low molecular or high molecular organic electroluminescence material. In the case where a low molecular organic material is used as the light emitting material, in addition to the light emitting layer including an organic material with light emitting properties, a hole injection layer and electron injection layer, furthermore, a hole transport layer and electron transport layer may be included to sandwich the light emitting layer 130. For example, the light emitting layer 130 includes a structure in which a layer including a light emitting material is sandwiched by a hole injection layer and electron injection layer. Furthermore, in addition to a hole injection layer and electron injection layer, the light emitting layer 130 may also be appropriately added with a hole transport layer, an electron transport layer, a hole block layer, and an electron block layer.

Furthermore, in one embodiment of the present invention, the light emitting element EMD may include what is called a top emission type structure in which light emitted by the light emitting layer 130 is irradiated to the opposing electrode 132 side. In this case, the pixel electrode 128 is preferred to be formed from a metal film with high reflectance or a stacked film including such a metal film sin order to reflect the light emitted by the light emitting layer 130 to the opposing electrode side. In a top emission type pixel, light is emitted from a surface of the reflecting side to a surface of a side arranged with a transistor of a pixel circuit in the light emitting element EMD. As a result, it is possible to form a pixel with a high aperture ratio without receiving the effects of the arrangement a transistor arranged in a pixel.

In the case where the light emitting layer 130 is stacked in sequence with a hole injection layer, light emitting layer, and electron injection layer, it is preferred to use ITO (Indium Tin Oxide) which has excellent hole injection properties for the pixel electrode 128. ITO is one type of translucent conductive material and while it has a high transparency to the visible light band, it has very low reflectance. As a result, a stacked layer structure may be applied of a translucent conductive material and light reflecting layer represented by ITO or IZO (Indium Zinc Oxide) in order to add a function for reflecting light to the pixel electrode 128. A light reflecting film is preferred to be formed using aluminum (Al) or silver (Ag) or an alloy material or compound material of aluminum (Al) or silver (Ag). For example, an alloy material or compound material in which a few atomic percent of titanium (Ti) is added to aluminum (Al) may be used as the light reflecting film. Since these metal materials have high reflectance with respect to light in the visible light band, it is possible to increase the amount of reflected light emitted to the pixel electrode 128 from the light emitting layer 130. Furthermore, the light reflecting film is not limited to these metals and apart from the metal material mentioned above, titanium (Ti), nickel (Ni), molybdenum (Mo) and chrome (Cr) may also be used.

A sealing layer 136 is arranged in an upper layer of the light emitting element EMD. Although the sealing layer 136 is not limited, an insulation layer formed from an inorganic insulation material and an insulation layer formed from an organic resin layer may be stacked. The sealing layer 136 covers the light emitting element EMD and is arranged in order to prevent the infiltration of water and the like. In the case of the top emission type structure shown in FIG. 13, it is preferred that translucency is provided using a cover film such as silicon nitride or aluminum oxide as the sealing layer 136. In addition, a second substrate may be arranged in an upper part of the sealing layer 136 and a filler material may be arranged therebetween.

As explained above, according to one embodiment of the present invention, in a signal writing and offset cancel time period, since a fifth switching element EMT is turned OFF while a first voltage PVDD_H which is high voltage is applied and the threshold voltage of a drive transistor is compensated, it is possible to provide a high margin to an offset cancel operation. Furthermore, since the fifth switching element EMT is turned OFF, in an offset cancel time period, a large current does not flow via a power supply line, the effects of a drop in voltage due to wire resistance are relieved, and it is possible to reduce variation in an offset cancel operation in a pixel region 102. In addition, at the time of an offset cancel operation, by applying the first voltage PVDD_H which is a high voltage from power lines arranged in a mesh shape in a row direction and column direction, the effects of a drop in voltage due to wire resistance are relieved, and it is possible to make a luminosity distribution uniform particularly in a horizontal direction. Furthermore, by adding a control signal of a switching element for controlling a connection between a drain and gate of a drive transistor to a high level, low level two value voltage signal, and driving the first switching element with waveforms of three levels added with a second low level state higher than a low level, it is possible to prevent the generation of light spots in a light emitting period while compensating for a threshold voltage of a drive transistor.

What is claimed is:

1. A display device comprising:
a pixel including a drive transistor, a first switching element, a storage capacitor, a second switching element, a third switching element, a fourth switching element, a light emitting element, a fifth switching element and a sixth switching element;
the drive transistor including a first terminal, a second terminal, and a gate which controlling a current flowing between the first terminal and the second terminals;
the first switching element controlling a connection between the second terminal and the gate of the drive transistor;
the storage capacitor including a first terminal and a second terminal, the second terminal of the storage capacitor connected to the gate of the driving transistor;
the second switching element controlling a connection between the first terminal of the storage capacitor and a first signal line supplied with a data signal;
the third switching element arranged in parallel with the second switching element and controlling a connection between the first terminal of the storage capacitor and a second signal line supplied with a reference signal;

the fourth switching element controlling a connection between the first terminal of the drive transistor and a first power supply line supplied with a first voltage;

the light emitting element including a first terminal and a second terminal, the first terminal of the light emitting element connected with the second terminal of the drive transistor and the second terminal of the light emitting element connected with a second power supply line supplied with a second voltage lower than the first voltage;

the fifth switching element controlling a connection between the second terminal of the drive transistor and the first terminal of the light emitting element; and the sixth switching element controlling a connection between the first terminal of the drive transistor and a third power supply line supplied with a third voltage lower than the first voltage and higher than the second voltage.

2. The display device according to claim 1, farther comprising:

a seventh switching element, the seventh switching element controlling a connection between the first terminal of the drive transistor and a first power supply line, and the sixth switching element and the seventh switching element is operated exclusively.

3. The display device according to claim 2, wherein the first power supply line is arranged in a column direction and the third power supply line is arranged in a row direction.

4. The display device according to claim 2, further comprising:

a reset time period during which the first switching element and the fifth switching element are turned ON, the fourth switching element is turned OFF, a reference voltage is applied to the storage capacitor from the second signal line via the third switching element, and a third voltage is applied to the first terminal of the drive transistor from the third power supply line;

a signal programming and offset cancel time period during which the first switching element and the fourth switching element are turned ON, the fifth switching element is turned OFF, a voltage based on a data signal from the first signal line is applied to the first terminal of the storage capacitor via the second switching element, and the first voltage is applied from the first power supply line and the third power supply line to the first terminal of the drive transistor; and a light emitting time period during which the first switching element is turned OFF, the fourth switching element and the fifth switching element are turned ON, a reference voltage is applied to the first terminal of the storage capacitor via the third switching element, and the light emitting element emits light by a current flowing from the first power supply line via the drive transistor.

5. The display device according to claim 2, wherein the first switching element, the second switching element, the fifth switching element and the sixth switching element are arranged in a first conductivity type transistor, and the third switching element, the fourth switching element and the seventh switching element are arranged in a second conductivity type transistor, the second conductivity type is opposite to the first conduction type.

6. The display device according to claim 1, further comprising:

a reset time period during which the first switching element and the fifth switching element are turned ON, the fourth switching element is turned OFF, a reference voltage is applied to the storage capacitor from the second signal line via the third switching element, and a third voltage is applied to the first terminal of the drive transistor from the third power supply line;

a signal programming and offset cancel time period during which the first switching element and the fourth switching element are turned ON, the fifth switching element is turned OFF, a voltage based on a data signal from the first signal line is applied to the first terminal of the storage capacitor via the second switching element, and the first voltage is applied from the first power supply line to the first terminal of the drive transistor; and a light emitting time period during which the first switching element is turned OFF, the fourth switching element and the fifth switching element are turned ON, a reference voltage is applied to the first terminal of the storage capacitor via the third switching element, and the light emitting element emits light by a current flowing from the first power supply line via the drive transistor.

7. The display device according to claim 6, wherein the first switching element is a transistor, and a control signal including a first voltage level turning the first switching element ON, a second voltage level turning the first switching element OFF and a third voltage level higher than the second voltage level is applied to a gate of the first switching element as transistor, and in at least the light emitting period, the first switching element is maintained in an OFF state by a control signal at the third voltage level.

8. The display device according to claim 1, wherein a plurality of the pixels is arranged and the fourth switching element is shared among adjacent pixels.

9. The display device according to claim 1, wherein a plurality of the pixels is arranged and the second switching element and the third switching element are shared among adjacent pixels.

10. The display device according to claim 1, wherein the first switching element, the second switching element and the fifth switching element are arranged in a first conductivity type transistor, and the third switching element and the fourth switching element are arranged in a second conductivity type transistor, the second conductivity type is opposite to the first conductivity type.

11. A method for driving a display device, the display device comprising;

a pixel including a drive transistor, a first switching element, a storage capacitor, a second switching element, a third switching element, a fourth switching element, a light emitting element, a fifth switching element and a sixth switching element; the drive transistor including a first terminal, a second terminal and a gate which controlling a current flowing between the first terminal and the second terminals; the first switching element controlling a connection between the second terminal and the gate of the drive transistor; the storage capacitor including a first terminal and a second terminal, the second terminal of the storage capacitor connected to the gate of the driving transistor; the second switching element controlling a connection between the first terminal of the storage capacitor and a first signal line supplied with a data signal; the third switching element arranged in parallel with the second switching element and controlling a connection between the first terminal of the storage capacitor and a second signal line supplied with a reference signal; the fourth switching element controlling a connection between the first terminal of the drive transistor and a first power supply line supplied with a first voltage; the light emitting element including a first terminal and a second terminal, the first terminal of the light emitting element connected with the second terminal of the drive transistor and the second terminal of the light emitting element connected with a second power supply line supplied with a second voltage lower than the first voltage; and the fifth switching element controlling a connection between the second terminal of the drive transistor and the first terminal of the light emitting element; the sixth switching element controlling a connection between the first terminal of the drive transistor and a third power supply line supplied with a third voltage lower than the first voltage and higher than the second voltage, the method comprising:

in a reset time period the first switching element and the fifth switching element are turned ON, the fourth switching element is turned OFF, a reference voltage is applied to the storage capacitor from the second signal line via the third switching element, and a third voltage is applied to the other input/output terminal of the drive transistor from the third power supply line;

in a signal programming and offset cancel time period the first switching element and the fourth switching element are turned ON, the fifth switching element is turned OFF, a voltage based on a data signal from the first signal line is applied to the other terminal of the storage capacitor via the second switching element, and the first voltage is applied from the first power supply line and the third power supply line to the first terminal of the drive transistor; and in a light emitting time period the first switching element is turned OFF, the fourth switching element and the fifth switching element are turned ON, a reference voltage is applied to the first terminal of the storage capacitor via the third switching element, and the light emitting element emits light by a current flowing from the first power supply line via the drive transistor.

12. The method of driving a display device according to claim 11, farther comprising a seventh switching element, the seventh switching element controlling a connection between the first terminal of the drive transistor and a first power supply line, and the sixth switching element and the seventh switching element is operated exclusively, in the signal programming and offset cancel time period, the first voltage is applied to the first terminal of the drive transistor from the first power supply line.

13. The method of driving a display device according to claim 12, wherein the first power supply line is arranged in a column direction, the third power supply line is arranged in a row direction, and the first voltage is applied to the first terminal of the drive transistor from the first power supply line and the third power supply line.

14. The method of driving a display device according to claim 11, wherein in the light emitting time period, the first switching element is applied with a control signal of a third voltage level lower than the first voltage level turning the first switching element ON and higher than the second voltage level turning the first switching element OFF.

15. A display device comprising:
a first pixel, a second pixel, a third pixel, and fourth pixel, each of the first to the fourth pixel including a drive transistor, a first switching element, a storage capacitor, a second switching element, a third switching element, a fourth switching element, a light emitting element and a fifth switching element;

the drive transistor arranged including a first terminal, a second terminal and a gate which controlling a current flowing between the first terminal and the second terminals;

the first switching element controlling a connection between the second terminals and the gate of the drive transistor;

the storage capacitor including a first terminal and a second terminal, the second terminal of the storage capacitor connected to the gate of the driving transistor;

the second switching element controlling a connection between the first terminal of the storage capacitor and a first signal line supplied with a data signal;

the third switching element arranged in parallel with the second switching element and controlling a connection between the first terminal of the storage capacitor and a second signal line supplied with a reference signal;

the fourth switching element controlling a connection between the first terminal of the drive transistor and a first power supply line supplied with a first voltage;

the light emitting element including a first terminal and a second terminal, the first terminal of the light emitting element connected with the second terminal of the drive transistor and the second terminal of the light emitting element connected with a second power supply line supplied with a second voltage lower than the first voltage; and the fifth switching element controlling a connection between the second terminal of the drive transistor and the first terminal of the light emitting element;

wherein
each of the drive transistor included in the first to the fourth pixels connected to a third power supply line connected with a sixth switching element controlling the application of a third voltage lower than the first voltage and higher than the second voltage to the first terminal, the first and the second pixel, and the third and the fourth pixel are arranged in a row direction, the first and the third pixel, and the second and the fourth pixel are arranged in a column direction, the fourth switching element is shared between the first to fourth pixels, and the second switching element and the third switching element are shared between the first and third pixels, and the second and fourth pixels arranged in a column direction.

16. The display device according to claim 15, further comprising:

a reset time period during which in each of the first to fourth pixels, the first switching element and the fifth switching element are turned ON, the fourth switching element is turned OFF, a reference voltage is applied to the storage capacitor from the second signal line via the third switching element, and a third voltage is applied to the first terminal of the drive transistor from the third power supply line;

a first signal programming and offset cancel time period during which in each of the first pixel and the second pixel, the first switching element and the fourth switching element are turned ON, the fifth switching element is turned OFF, a voltage based on a data signal from the first signal line is applied to the first terminal of the storage capacitor via the second switching element, the first voltage is applied from the first power supply line to the first terminal of the drive transistor, and in the third pixel and the fourth pixel, the first switching element is OFF;

a second signal programming and offset cancel time period during which in each of the third pixel and the fourth pixel, the first switching element and the fourth switching element are turned ON, the fifth switching element is turned OFF, a voltage based on a data signal from the first signal line is applied to the first terminal of the storage capacitor via the second switching element, the first voltage is applied from the first power supply line to the first terminal of the drive transistor, and in the first pixel and the second pixel, the first switching element is OFF; and a light emitting time period during which n each of the first to fourth pixels, the first switching element is turned OFF, the fourth switching element and the fifth switching element are turned ON, a reference voltage is applied to the first terminal of the storage capacitor via the third switching element, and the light emitting element emits light by a current flowing from the first power supply line via the drive transistor.

17. The display device according to claim 16, further comprising:

a waiting time period during which in each of the first to fourth pixels, the first switching element is turned OFF, the second switching element and the third switching element are maintained in an ON state, a reference voltage is applied from the second signal line to the storage capacitor via the third switching element, the fifth switching element changes from ON to OFF, next the fourth switching element changes from OFF to ON, the sixth switching element changes from ON to OFF, and the first voltage is applied to the first terminal of the drive transistor, the waiting time period during between the reset time period and the first and second signal programming and offset cancel time periods.

* * * * *